United States Patent
Lee et al.

(10) Patent No.: US 9,231,166 B2
(45) Date of Patent: Jan. 5, 2016

(54) LIGHT EMITTING DEVICE AND LIGHTING APPARATUS HAVING THE SAME

(71) Applicants: Song Eun Lee, Seoul (KR); Gyu Hyeong Bak, Seoul (KR); Bong Kul Min, Seoul (KR)

(72) Inventors: Song Eun Lee, Seoul (KR); Gyu Hyeong Bak, Seoul (KR); Bong Kul Min, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 480 days.

(21) Appl. No.: 13/673,478

(22) Filed: Nov. 9, 2012

(65) Prior Publication Data

US 2013/0121000 A1 May 16, 2013

(30) Foreign Application Priority Data

Nov. 16, 2011 (KR) .......................... 10-2011-0119822

(51) Int. Cl.
| | | |
|---|---|---|
| F21V 7/00 | (2006.01) | |
| F21V 33/00 | (2006.01) | |
| F21S 4/00 | (2006.01) | |
| F21V 21/00 | (2006.01) | |
| H01L 33/00 | (2010.01) | |
| H01L 33/48 | (2010.01) | |
| H01L 33/58 | (2010.01) | |
| H01L 33/60 | (2010.01) | |
| H01L 25/16 | (2006.01) | |

(Continued)

(52) U.S. Cl.
CPC .............. *H01L 33/486* (2013.01); *H01L 33/58* (2013.01); *H01L 33/60* (2013.01); *H01L 25/167* (2013.01); *H01L 33/52* (2013.01); *H01L 33/62* (2013.01); *H01L 2224/48091* (2013.01); *H01L 2224/48247* (2013.01); *H01L 2924/3025* (2013.01)

(58) Field of Classification Search
CPC ............ H01L 23/49575; F21V 23/004; F21V 23/005; F21V 23/006
USPC ................ 362/308, 234, 249.02; 257/98, 100
See application file for complete search history.

(56) References Cited

U.S. PATENT DOCUMENTS

| | | | | |
|---|---|---|---|---|
| 7,524,098 | B2 * | 4/2009 | Vennetier et al. .............. | 362/555 |
| 8,702,294 | B2 * | 4/2014 | Lee et al. ....................... | 362/612 |
| 2002/0011601 | A1 | 1/2002 | Furukawa et al. | |

(Continued)

FOREIGN PATENT DOCUMENTS

| | | |
|---|---|---|
| EP | 1 178 544 A2 | 2/2002 |
| EP | 2 187 459 A2 | 5/2010 |

(Continued)

OTHER PUBLICATIONS

European Search Report issued in Application No. 12192726.3 dated Oct. 29, 2015.

*Primary Examiner* — Y M Lee
*Assistant Examiner* — William N Harris
(74) *Attorney, Agent, or Firm* — Ked & Associates, LLP

(57) ABSTRACT

Disclosed are a light emitting device and a lighting apparatus having the same. The light emitting device includes a plurality of lead frames, a first body having reflectance, disposed on top surfaces of the lead frames and having an open region at a predetermined region of the top surfaces of the lead frames, a second body having transmittance, having a first opening corresponding to the open region of the first body, and disposed on a top surface of the first body, a light emitting chip on at least one of the lead frames exposed in the first opening of the second body, and a first resin layer disposed in the first opening of the second body to cover the light emitting chip.

20 Claims, 12 Drawing Sheets

(51) Int. Cl.
    *H01L 33/52*    (2010.01)
    *H01L 33/62*    (2010.01)

(56)    References Cited

U.S. PATENT DOCUMENTS

2007/0019416  A1*   1/2007   Han et al. ....................... 362/307
2007/0029564  A1    2/2007   Han et al.
2009/0303713  A1*  12/2009   Chang et al. ................... 362/234
2010/0123156  A1    5/2010   Seo et al.
2011/0114979  A1    5/2011   Jang et al.
2012/0037944  A1    2/2012   Takine
2012/0187865  A1*   7/2012   Chung et al. ................... 315/294

FOREIGN PATENT DOCUMENTS

EP         2 323 183 A1      5/2011
JP         2010-238833 A     10/2010
WO         WO 2010/150754 A1 12/2010

* cited by examiner

LIGHT EMITTING DEVICE AND LIGHTING APPARATUS HAVING THE SAME

The present application claims priority under 35 U.S.C. §119(a) of Korean Patent Application No. 10-2011-0119822 filed on Nov. 16, 2011, which is hereby incorporated by reference in its entirety.

BACKGROUND

The embodiment relates to a light emitting device and a lighting apparatus including the same.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by urging ultraviolet ray, which is generated through the high-voltage discharge, to collide with a phosphor.

In addition, the LED generates the light by using the potential gap of the semiconductor device, so the LED is advantageous as compared with conventional light sources in terms of life span, response characteristics and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

SUMMARY

The embodiment provides a light emitting apparatus having a wide light orientation angle.

The embodiment provides a light emitting apparatus including a first body having a higher reflectance than transmittance around a light emitting chip and a second body having a higher transmittance than reflectance on the first body.

The embodiment provides a light emitting device including a second body representing transmittance around a light emitting chip and an optical lens having a concave part and a total reflection surface concaved toward the light emitting chip on the light emitting chip.

The embodiment provides a lighting apparatus having the light emitting device.

According to the embodiment, the light emitting device includes a plurality of lead frames, a first body having a higher reflectance than transmittance, disposed on top surfaces of the plurality lead frames and having an open region at a predetermined region of the top surfaces of the plurality of lead frames, a second body having a higher transmittance than reflectance, having a first opening corresponding to the open region of the first body, and disposed on a top surface of the first body, a light emitting chip on at least one of the lead frames exposed in the first opening of the second body, and a first resin layer disposed in the first opening of the second body to cover the light emitting chip.

According to the embodiment, the light emitting device includes a first lead frame having a cavity, a second lead frame spaced apart from the first lead frame, a first body having a higher reflectance than transmittance, disposed on the first and second lead frames, and exposing a predetermined region of top surfaces of the first and second lead frames, a second body having a higher transmittance than reflectance and having a first opening corresponding to a central region of the first body, and disposed on a top surface of the first body, a light emitting chip disposed in a cavity of the first lead frame and electrically connected to the first and second lead frames, and a first resin layer in the cavity.

According to the embodiment, there is provided a lighting apparatus including the light emitting device, a module substrate having the light emitting device arrayed thereon, and an optical member on at least one side of the light emitting device.

DETAILED DESCRIPTION OF THE EMBODIMENTS

Figure 1:
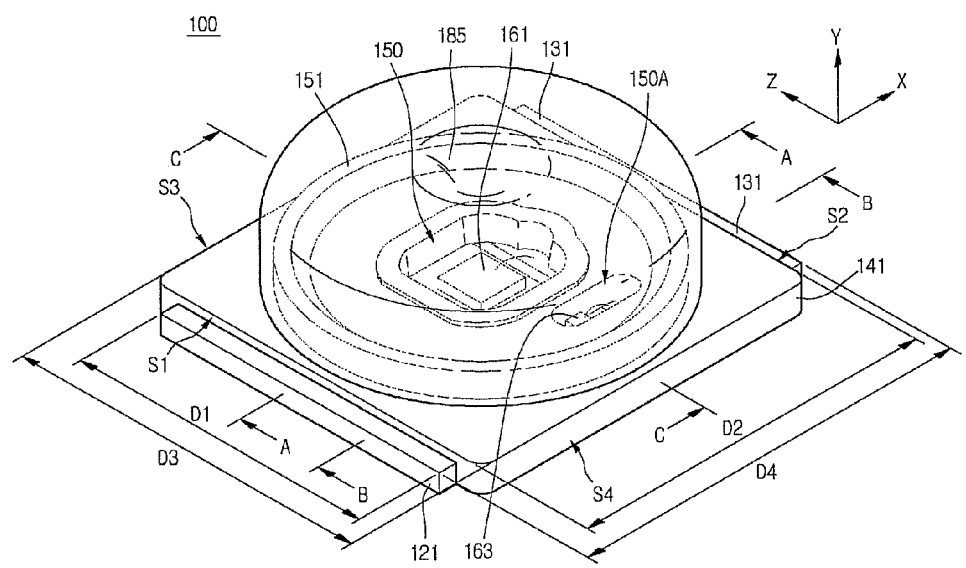
FIG. 1 is a perspective view showing a light emitting device according to a first embodiment.

In the following description, when a predetermined part "includes" a predetermined component, the predetermined part does not exclude other components, but may further include other components unless otherwise indicated. In the description of the embodiments, it will be understood that when a layer, a film, a region, or a plate is referred to as being "on" another layer, another film, another region, or another plate, it can be "directly" or "indirectly" on the other layer, other film, other region, other plate, or one or more intervening layers may also be present. In contrast, when a part is referred to as being "directly on" another part, the intervening layer is not present.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

Figure 2:
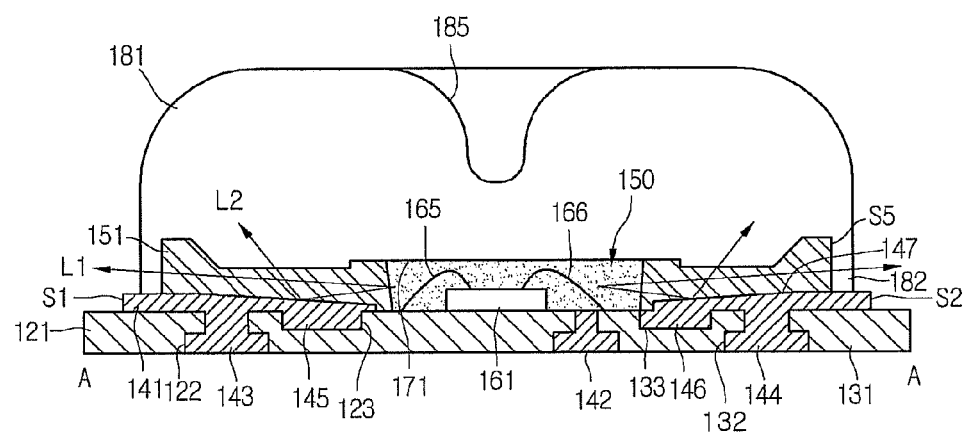
FIG. 2 is a sectional view taken along line A-A of the light emitting device shown in FIG. 1.
Figure 3:
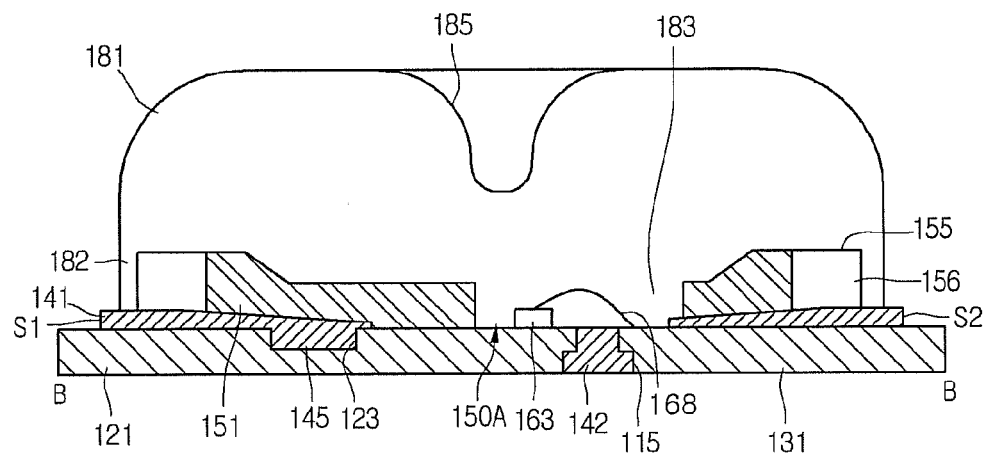
FIG. 3 is a sectional view taken along line B-B of the light emitting device shown in FIG. 1.
Figure 4:
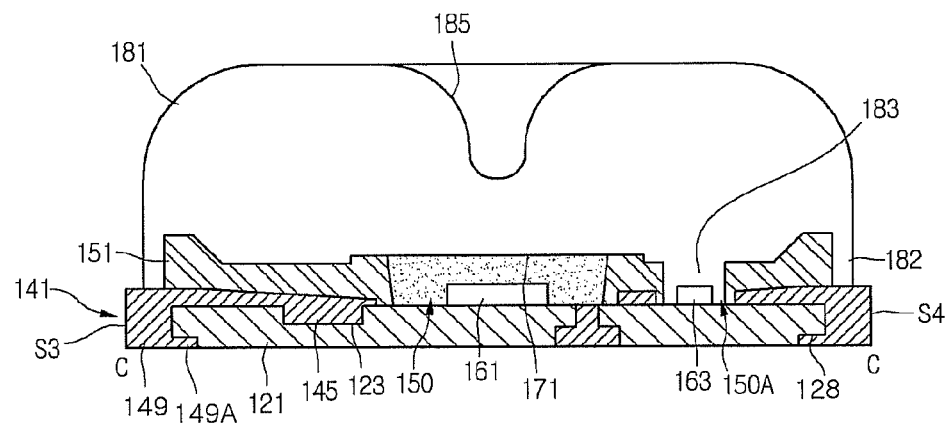
FIG. 4 is a sectional view taken along line C-C of the light emitting device shown in FIG. 1.
Figure 5:
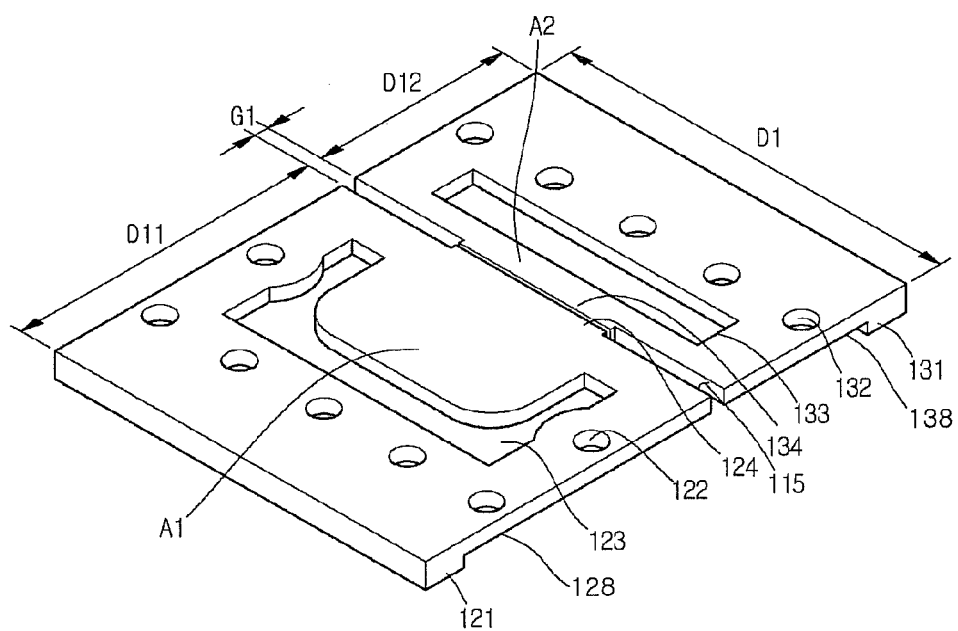
FIG. 5 is a perspective view showing a lead frame in the light emitting device shown in FIG. 2.

FIG. 1 is a perspective view showing a light emitting device according to a first embodiment, FIG. 2 is a sectional view taken along line A-A of the light emitting device shown in FIG. 1, and FIG. 3 is a sectional view taken along line B-B of the light emitting device shown in FIG. 1. FIG. 4 is a sectional view taken along line C-C of the light emitting device shown in FIG. 1, and FIG. 5 is a perspective view showing a lead frame in the light emitting device shown in FIG. 2.

Referring to FIGS. 1 to 5, a light emitting device 100 includes a plurality of lead frames 121 and 131 spaced apart from each other, a first body 141 having an open upper region and formed on the lead frames 121 and 131, a second body 151 having a first opening 150, disposed on the first body 141, and including a material different from that of the first body 141, a light emitting chip 161 disposed at least one of the lead frames 121 and 131 exposed through the first opening 150, a resin layer 171 surrounding the light emitting chip 161 at the first opening 150, and an optical lens 181 disposed on the resin layer 171 and the second body 151.

As shown in FIG. 1, in the light emitting device 100, a first direction X may be defined as a direction of a length D4, a second direction Z perpendicular to the first direction X may be defined as a direction of a width D3, and a direction Y perpendicular to the top surface of the light emitting chip 161 may be defined as an optical axis direction, or a perpendicular line direction of the light emitting chip 161.

The length D4 of the light emitting device 100 may be an interval between outer surfaces of the lead frames 121 and 131. The length D4 of the light emitting device 100 may be the interval between both lateral sides S1 and S2 of the first body 141. In this case, the outer surfaces of the lead frames 121 and 131 may not protrude toward both lateral sides S1 and S2 of the first body 141. Both end portions of the lead frames 121 and 131 may protrude beyond both lateral sides S1 and S2 of the first body 141 for the adhesion with an adhesive member (not shown) with solder paste. The length D2 of the first body 141 may be the interval between both lateral sides S1 and S2, and may be shorter than or equal to the length D4 of the light emitting device 100.

The width of the light emitting device 100 may be the width D3 of the first body 141, and the width D3 of the first body 141 may be wider than the width D1 of each of the lead frames 121 and 131. If the width D3 of the first body 141 is wider than the width D1 of each of the lead frames 121 and 131, each of the lead frames 121 and 131 may not be exposed, and moisture can be prevented from being infiltrated. In addition, the top surface of the first body 141 reflects light, so that the orientation angle of light may be increased.

The lead frames 121 and 131 include the first lead frame 121 and the second lead frame 131 as shown in FIGS. 2 and 5. The first lead frame 121 includes a first groove 123 and a first hole 122. The first groove 123 may be formed by a preset depth from the top surface of the first lead frame 121, and defined at a peripheral portion of a chip region A1, wherein the chip region A1 includes a bonding region of the light emitting chip 161. In this case, the peripheral portion of the chip region A1 may be a region between the chip region A1 and one lateral side of the first lead frame 121, between the chip region A1 and two lateral sides or more of the first lead frame 121. A depth of the first groove 123 may be lower than the thickness of the first lead frame 121 without the first groove 123, or may be equal to the depth of another groove. This represents that a bottom portion of the first lead frame 121 opposite to the first groove 123 may be flat or protrude. A third coupling portion 145 of the first body 141 may be coupled with the first groove 123.

A plurality of first holes 122 are arranged while being spaced apart from each other. The holes 122 are disposed between the first groove 123 and lateral sides of the first lead frame 121. A material of the first body 141 may be filled in each first hole 122.

The second lead frame 131 includes a second groove 133 and a second hole 132. The second groove 133 may have a preset depth, and may be formed in a direction of the width D1 of the second lead frame 131. In addition, the length of the second groove 133 may be greater than a length D12 of the second lead frame 131. The width of the second groove 133 may be wider than a width G1 of a space, that is, a gap to fill the first body 141. The second groove 133 may be formed at an outside of a bonding region A2. In other words, the second groove 133 may be formed corresponding to the first lead frame 121. A plurality of second holes 132 are arranged at an outside of the second groove 133 while being spaced apart from each other by a predetermined distance. The second groove 133 and the second hole 132 may be filled with a material constituting the first body 141. A depth of the second groove 133 may be lower than the thickness of the second lead frame 131 without the second groove 133, or may be equal to that of the second lead frame 131 in other regions. This may represent that a bottom portion of the second lead frame 131 opposite to the second groove 133 may be flat or protrude.

One or at least two of the first holes 122 and the second holes 132 may be formed with a width having a wider low portion and a narrower upper portion as shown in FIG. 2, but the embodiment is not limited thereto. At least one of the first hole 122, the second hole 132, the first groove 123, and the second groove 133 may not be formed in the first and second lead frames 121 and 131, but the embodiment is not limited thereto. In addition, a plurality of the first and second grooves 123 and 133 may spaced apart from each other in the lead frames 121 and 131, but the embodiment is not limited thereto.

A first end portion 124 of the first lead frame 121 corresponds to a second end portion 134 of the second lead frame 131. The first end portion 124 may protrude from a lateral side of the first lead frame 121 toward the second end portion 134, and the second end portion 134 may protrude from the lateral side of the second lead frame 131 toward the first end portion 124. A gap 115 between the first and second lead frames 121 and 131 is an interval G1, and may be wider than the interval between the first and second end portions 124 and 134. As the interval between the first end portion 124 of the first lead frame 121 and the second end portion 134 of the second lead frame 131 is reduced, the bonding space of a light emitting chip 161, a first wire 166, and a second wire 167 can be ensured. Alternatively, the first and second end portions 124 and 134 may not protrude. In this case, the interval G1 of the gap 115 may be constant.

The first lead frame 121 includes a first step structure 128 recessed at the first end portion 124 and at a lateral side of the first lead frame 121. The first step structure 128 may be formed by etching a preset region of the bottom surface of the first lead frame 121. For example, the first step structure 128 may be recessed by etching the bottom surface of the first end portion 124, and the bottom surfaces of lateral side portions of the first lead frame 121 adjacent to third and fourth lateral sides S3 and S4 of the first body 141. The first step structure 128 may be formed in at least one lateral side of the bottom surface of the first lead frame 121, but the embodiment is not limited thereto.

The second lead frame 131 includes a second step structure 138 recessed at the first end portion 134 and at a lateral side of the second lead frame 131. The second step structure 138 may be recessed by etching a preset region of the bottom surface of the second lead frame 131. For example, the second step structure 138 may be formed by etching the bottom surface of the second end portion 134 of the second lead frame 131, and the bottom surfaces of lateral side portions of the first lead frame 121 adjacent to third and fourth lateral sides S3 and S4 of the first body 141. However, the embodiment is not limited thereto.

The material constituting the first body 141 is filled in the first and second step structures 128 and 138, thereby preventing moisture from being infiltrated, and supporting the coupling of the first body 141. When comparing with regions without the first and second step structures 128 and 138, the area of the bottom surface of each lead frame 121 or 131 may be wider than the area of the top surface of each lead frame 121 or 131.

Although the first embodiment has been described in that two lead frames are employed, three lead frames or more may be formed. In addition, when viewed from the top, the first and second lead frames 121 and 131 may have a rectangular shape or another shape. In addition, at least a portion of the lead frames 121 and 131 may be bent, but the embodiment is not limited thereto.

A width D11 of the first lead frame 121 may be longer than a width D12 of the second lead frame 131. The area of the top surface of the first lead frame 121 may be wider than the area of the top surface of the second lead frame 131 because a light emitting chip is disposed on the first lead frame 121.

The first and second lead frames 121 and 131 include a metallic material, for example, at least one of titanium (Ti), copper (Cu), nickel (Ni), gold (Au), chrome (Cr), tantalum (Ta), platinum (Pt), tin (Sn), silver (Ag), and phosphorus (P). The first and second lead frames 121 and 131 may include a single metallic layer or different metallic layers, but the embodiment is not limited thereto.

As shown in FIGS. 2, 3, 5, and 6, the first body 141 is formed on the first and second lead frames 121 and 131. The first body 141 physically spaces the first lead frame 121 apart from the second lead frame 131, and fixedly supports the first and second lead frames 121 and 131.

The first body 141 may be filled in the first and second grooves 123 and 133 of the first and second lead frames 121 and 131, the first and second holes 122 and 132 of the first and second lead frames 121 and 131, and the gap between the first and second lead frames 121 and 131. In addition, the first body 141 may be formed at a predetermined thickness on the top surfaces of the first and second lead frames 121 and 131. The bottom surface of the first body 141 may be aligned in line with the bottom surfaces of the first and second lead frames 121 and 131. The top surface 147 of the first body 141 may be disposed higher than the top surfaces of the first and second lead frames 121 and 131.

The first body 141 may include a material representing reflectance higher than transmittance with respect to the wavelength emitted from the light emitting chip 161. For example, the first body 141 may include a material representing at least 70% of reflectance. If the material constituting the first body 141 has at least 70% of reflectance, the material constituting the first body 141 may include a reflective material or a non-transmissive material. The first body 141 may include an insulating material based on resin, for example, may include resin material such as polyphthalamide (PPA). Alternatively, the first body 141 may include thermal setting resin including silicon, epoxy resin, thermosetting resin such as a plastic material, a high heat resistance material, or a high light resistance material. If the first body 141 includes silicon or epoxy, the first body 141 includes white resin having a metallic oxide. The metallic oxide includes a material such as $TiO_2$, $SiO_2$, or $Al_2O_3$.

In addition, the first body 141 may selectively include acid anhydride, an antioxidant, a release agent, an optical reflector, an inorganic filling agent, a curing catalyst, a light stabilizer, a lubricant, or a titanium dioxide.

The first body 141 may be molded by using at least one selected from the group consisting of epoxy resin, modified epoxy resin, silicon resin, modified silicon resin, acrylic resin, and urethane resin. For instance, the first body 141 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture after adding DBU (1.8-Diazabicyclo(5,4,0)undecene-7) serving as a hardening accelerator and ethylene glycol, titanium oxide pigment or glass fiber serving as a promoter to the epoxy resin, but the embodiment is not limited thereto.

In addition, a light shielding material or a dispersing agent is added in the first body 141, thereby reducing transmitting light. In addition, in order to have a predetermined function, the first body 141 includes at least one selected from the group consisting of a dispersing agent, pigments, phosphors, reflective materials, light shielding materials, a light stabilizer, and a lubricant mixed with thermal setting resin.

The area of the top surface 147 of the first body 141 may be greater than the area of the bottom surface of the second body 151. The first body 141 supports the second body 151 disposed on the top surface 147. The top surface 147 of the first body 141 can effectively reflect the incident light, which is more widely than the bottom surface of the second body 151, under the bottom surface of the second body 151. Accordingly, the light loss can be reduced, and the light extraction efficiency can be increased.

Figure 6:
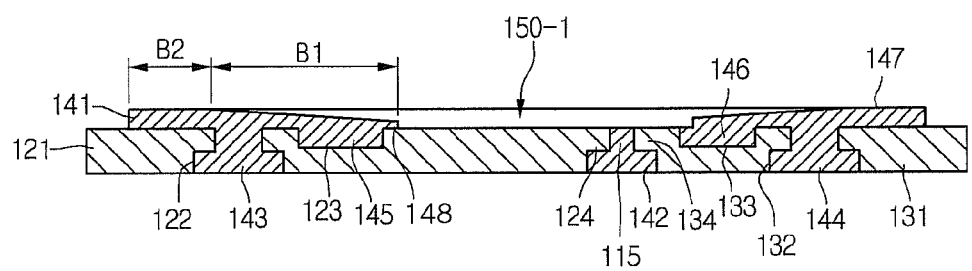
FIG. 6 is a view showing the assembling of the lead frame and the first body in the light emitting device shown in FIG. 2.
Figure 8:
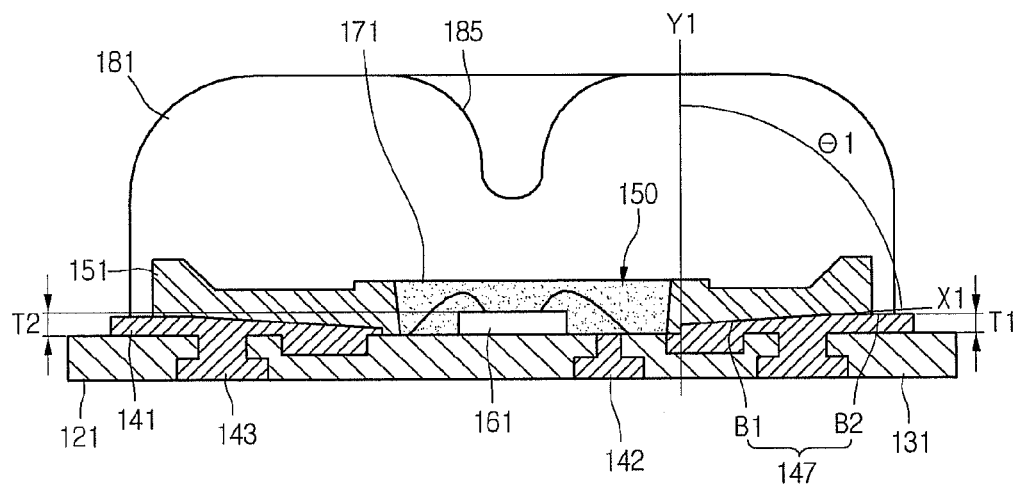
FIG. 8 is a view showing the height of the top surface of the first body and the inclination angle of the first body in the light emitting device shown in FIG. 2.

Referring to FIGS. 6 and 8, a portion of the first body 141 under the top surface of the lead frames 121 and 131 is defined as a lower portion of the first body 141, and a portion of the first body 141 on the top surface of the lead frames 121 and 131 is defined as an upper portion of the first body 141. In addition, the first body 141 may be divided into an inner region B1 and an outer region B2. The inner region B1 is close to the light emitting chip 161 or/and the open region 150-1. The outer region B2 is provided at the outside of the inner region B1, and adjacent to an outer surface of the first body 141.

The top surface of the inner region B1 of the first body 141 may have an inclined surface, a convex surface, or a concave surface. The height of the top surface of the inner region B1 may be lower than the height of the top surface of the light emitting chip 161. In this case, a portion of the inner region B1 adjacent to the outer region B2 may have a thickness thicker than the thickness of a portion of the inner region B1 adjacent to the open region 150-1. The thickness of the inner region B1 may be an interval between the top surface of the lead frame 121 and 131 and the top surface of the inner region B1. The portion of the inner region B1 adjacent to the outer region B2 may have a maximum thickness in the inner region B1 and the portion of the inner region B1 adjacent to the open region 150-1 may have a minimum thickness in the inner region B1.

On the assumption that the thickness of the inner region B1 is equal to the interval between the top surface of each of the lead frames 121 and 131 and the top surface of the inner region B1, the thickness of the inner region B1 is gradually increased outward from the light emitting chip 161. The top surface of the outer region B2 extends from the inner region B1, and the outer region B2 has a thickness T1 thicker than that of the inner region B1 with respect to the top surfaces of the first and second lead frames 121 and 131. The thickness T1 of the outer region B2 is equal to the interval between the top surface of each lead frame 121 or 131 and the top surface of the outer region B2 as shown in FIG. 8. The top surface of the outer region B2 may have a flat surface, an inclined surface having a thickness gradually increased outward from the light emitting chip 161, a convex surface, or a concave surface. In this case, the convex structure is a structure protruding upward from an optical axis of the light emitting chip 161, and the concave structure is a structure recessed downward from the optical axis of the light emitting chip 161.

The maximum interval between the top surface 147 of the first body 141 and the top surface of the lead frame 121 or 131 is a thickness T1 of the outer region B2 of the first body 141, and the thickness T1 may be at least 50 μm, for example, may be in the range of 50 μm to 300 μm. The outer region B2 of the first body 141 may be the thickest region in the first body 141. In addition, the top surface 147 of the first body 141 may be aligned on a horizontally extending line from the top surface of the light emitting chip 161, or may make an interval (T2-T1) of at least 1 μm from the horizontally extending line from the top surface of the light emitting chip 161. Accordingly, the light emitted from the light emitting chip 161 can be effectively reflected. The thickness of the inner region B1 is thinner than the thickness T2 of the outer region B2, so that second light L2 horizontally directed from the light emitting chip 161 can be effectively reflected. In this case, the thickness T2 of the light emitting chip 161 may be in the range of 80 μm to 500 μm, for example, may be in the range of 80 μm to 150 μm, but the embodiment is not limited thereto.

The top surface of the inner region B1 of the first body 141 is inclined at a predetermined angle with respect to the top surface of the lead frame 121 or 131. For example, the top surface of the inner region B1 may be inclined at an angle of 1° to 25° with respect to the top surface of the lead frame 121 or 131.

The top surface of the outer region B2 may be parallel to the top surface of the lead frame 121 or 131. In this case, an angle between an extending line X1 from the top surface of the inner region B1 of the first body 141 and a perpendicular line Y1 perpendicular to the top surface of the light emitting chip 161 may be 89° or less, for example, may be in the range of 65° to 89°. In addition, the top surface of the inner region B1 of the first body 141 may have an angle of 135° to 180°. The light orientation angle of the light emitting device can be adjusted according to the angle between the extending line X1 from the top surface of the inner region B1 of the first body 141 and the perpendicular line Y1 perpendicular to the top surface of the light emitting chip 161.

As shown in FIGS. 2 and 6, the first body 141 includes a gap part 142, and first to fourth coupling parts 143, 144, 145, and 146. The gap part 142 is disposed at the gap 115 between the first lead frame 121 and the second lead frame 131. The width of the lower portion of the gap part 142 may be wider than that of the upper portion of the gap part 142. The top surface of the gap part 142 may be arranged in line with the top surface of the lead frame 121 or 131, or may protrude higher than the top surface of the lead frame 121 or 131. In this case, if the top surface of the gap part 142 protrudes higher than the top surfaces of the first and second lead frames 121 and 131, the upper portion of the gap part 142 is formed higher than the top surface of the first end portion 124 of the first lead frame 121 and the top surface of the second end portion 134 of the second lead frame 131, thereby preventing moisture from being infiltrated.

The first coupling part 143 is formed in the first hole 122 of the first lead frame 121, and the second coupling part 144 is formed in the second hole 132 of the second lead frame 131. The third coupling part 145 is formed in the first groove 123 of the first lead frame 121, and the fourth coupling part 146 is formed in the second groove 133 of the second lead frame 131. The first body 141 may be securely coupled with the first and second lead frames 121 and 131 through the gap part 142 and the coupling parts 143, 144, 145, and 146.

The first body 141 includes the open region 150-1 having an open upper portion, and the open region 150-1 may be formed inside the third and fourth coupling parts 145 and 146. In other words, the first and second grooves 123 and 133 may form boundary regions of the open region 150-1 of the first body 141. The third and fourth coupling parts 145 and 146 are formed in the first and second grooves 123 and 133 of the second lead frame 131, and the top surfaces of the third and fourth coupling parts 145 and 146 may be inclined, may have a step difference, or may be flat surface.

Figure 7:
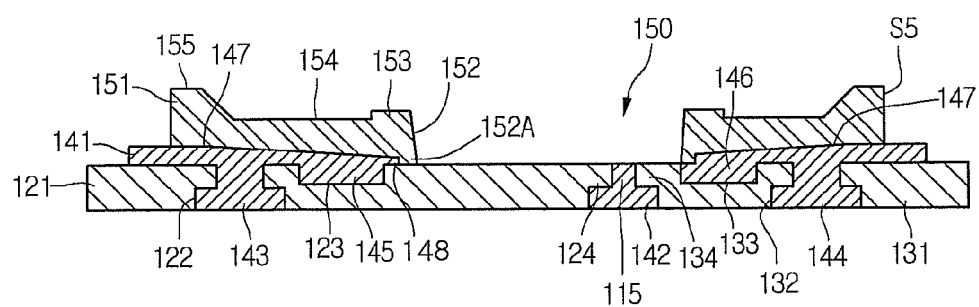
FIG. 7 is a view showing the assembling of the first and second bodies in the light emitting device of FIG. 2.

As shown in FIGS. 6 and 7, an inner side portion 148 of the first body 141 more extends from the first groove 123 of the first lead frame 121 toward the open region 150-1 to increase the contact area of an inner side portion 152A of the second body 151. In addition, since the first and second bodies 141 and 151 are coupled with each other, the strength of the first and second bodies 141 and 151 can be improved.

The first body 141 is a member to effectively reflect light of the light emitting chip 161, and may include a resin mold. The first body 141 includes the region 150-1 having an open central region. The top surfaces of the first and second lead frames 121 and 131 may be exposed through the open region 150-1. The open region 150-1 may have a circular shape or a polygonal shape. In addition, a portion of the open region 150-1 may have a curved shape. The first body 141 may have a substantially rectangular shape. An outer peripheral portion of the first body 141 may be formed in a polygonal shape when viewed from the top. Although the first body 141 has a rectangular shape, the first body 141 may have an oval shape, a circular shape, or another polygonal shape when viewed from the top.

As shown in FIGS. 1 and 2, the first body 141 may include the first and second lateral sides S1 and S2, which are opposite to each other, and the third and fourth lateral sides S3 and S4 which are adjacent to the first and second lateral sides S1 and S2 and opposite to each other. The corner of each of the first to fourth lateral sides S1 to S4 may have an angled surface or a curved surface.

An outer portion of the first lead frame 121 protrudes from the first lateral side S1 of the first body 141, and an outer portion of the second lead frame 131 protrudes from the second lateral side S2. As shown in FIGS. 1 and 4, the third and fourth lateral sides S3 and S4 of the first body 141 are formed outward beyond the outer portions of the first and second lead frames 121 and 131. Outer portions 149 constituting the third and fourth lateral sides S3 and S4 of the first body 141 cover the outer surfaces of the first and second lead frames 121 and 131. The lower end portions 149A of the outer portions 149 extend along the bottom surfaces of the first and second lead frames 121 and 131 from the outer portions 149 of the first body 141 may be coupled with the step structures 128 and 138 formed as shown in FIG. 5.

As shown in FIG. 2, the second body 151 may be formed on the first body 141. The second body 151 may include a transmissive material. For example, the second body 151 may include silicon-based resin or epoxy-based resin. The second body 151 may be formed through an injection molding scheme, and may include a transparent material. Accordingly, the second body 151 allows first and second lights L1 and L2 emitted from the light emitting chip 161 to effectively pass therethrough.

An outer surface S5 of the second body 151 may be disposed inward from a light exit surface 182 of the optical lens 181, and may make contact with the inner part of the light exit surface 182 of the optical lens 181. Accordingly, the coupling strength between the second body 151 and the optical lens 181 may be increased. The second body 151 may have a circular shape when viewed from the top. Alternatively, the second body 151 may have a polygonal shape or an oval shape when viewed from the top, but the embodiment is not limited thereto. The outer surface S5 of the second body 151 may be a light exit region. In addition, the outer surface S5 of the second body 151 may be a surface inclined or perpendicular to the top surfaces of the first and second lead frames 121 and 131. Alternatively, the outer surface S5 of the second body 151 may have a curved surface, for example, may have a semispherical shape. The curved outer surface can provide a wider light exit surface.

The width of the second body 151 may be less than the width D3 of the first body 141 as shown in FIG. 1. Alternatively, the width of the second body 151 may be equal to or greater than the width D3 of the first body 141. Accordingly, the contact area between the first and second bodies 141 and 151 is increased, thereby preventing moisture from being infiltrated into the interfacial surface between the first and second bodies 141 and 151 including different materials, and improving the reliability for the bonding in the interfacial surface between the first and second bodies 141 and 151.

The second body 151 includes a second thermosetting resin representing at least 70% of the transmittance with respect to the wavelength emitted from the light emitting chip 161. The second thermosetting resin may include at least one selected from the group of silicon resin, transmissive epoxy resin, modified epoxy resin, transmissive silicon resin, modified silicon resin, acrylate resin, and urethane resin. The second body 151 includes the mixture of the second thermosetting resin and at least one selected from the group consisting of a filler, a dispersing agent, figments, a phosphor, and a reflective material in order to have a predetermined function. In addition, the second thermosetting resin may contain a dispersing agent. For example, the dispersing agent may preferably include barium titanate, titanium oxide, aluminum oxide, and silicon oxide.

As shown in FIGS. 6 and 7, the second body 151 has the first opening 150, and the first opening 150 has an open upper portion to expose a portion of the lead frames 121 and 131. The first opening 150 may include a chip region A1 and a bonding region A2 of FIG. 5.

The first opening 150 may have a width narrower than a width of the open region 150-1 of the first body 141. An inner lateral side 152 of the second body 151 may be perpendicular to the top surface of the first lead frame 121 or the second lead frame 131, or may be inclined at an angle of 90° to 180°.

An inner lateral side 152A of the second body 151 may be closer to the light emitting chip 161 than an inner lateral side 148 of the first body 141, and may be make contact with the top surfaces of the lead frames 121 and 131. In addition, the inner lateral side 152A of the second body 151 makes contact with the top surface of the first body 141 to increase the adhesive strength with the first body 141. The structure can prevent moisture from efficiently being infiltrated.

The inner lateral side 152 of the second body 151 becomes the circumferential surface of the first opening 150. The height of the inner lateral side 152 of the second body 151 may be thicker than the thickness of the light emitting chip 161, and may be higher than high points of wires 166 and 167 of FIG. 2. For example, the thickness of the inner lateral side 152 may be in the range of about 250 μm to 500 μm, but the embodiment is not limited thereto. When viewed from the top, the first opening 150 may have an X-axial length X and a Z-axial width different from each other or equal to each other, but the embodiment is not limited thereto.

As shown in FIG. 7, a concave-convex structure, an unevenness structure, or a step difference structure may be formed on the upper portion of the second body 151. The second body 151 has a first protrusion 153 protruding at the inner part of the upper portion of the second body 151, a second protrusion 155 disposed at the outer part of the upper portion of the second body 151, and a third groove 154 formed between the first and second protrusions 153 and 155. The first and second protrusions 153 and 155 may protrude at different heights, and the third groove 154 may be formed at a depth lower than the top surface of the first protrusion 153. The coupling strength between the second body 151 and the optical lens 181 may be increased by the first protrusion 153, the second protrusion 155, and the third groove 154 formed at the upper portion of the second body 151 as shown in FIG. 2.

As shown in FIG. 2, one or a plurality of light emitting chips 161 may be disposed in the first opening 150. The light emitting chip 161 may be disposed at least one of the first and second lead frames 121 and 132 exposed through the bottom surface of the first opening 150 of the first body 141.

The light emitting chip 161 may be bonded onto the first lead frame 121 through an adhesive member, connected with the first lead frame 121 through the first wire 165, and connected with the second lead frame 131 through the second wire 166. The adhesive member may include an insulating material or a conductive material.

Alternatively, the light emitting chip 161 may be bonded to the first lead frame 121 through a conductive adhesive member, and connected with the second lead frame 131 through a wire. The light emitting chip 161 may be bonded to the first and second lead frames 121 and 131 through a flip scheme. The light emitting chip 161 is driven by receiving power from the first and second lead frames 121 and 131.

Figure 16:
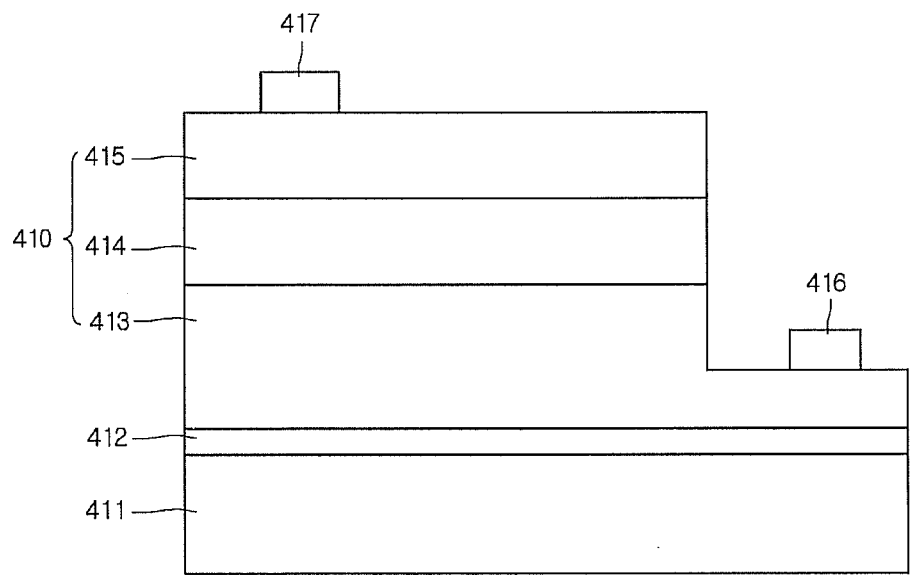
FIG. 16 is a sectional view showing one example of a light emitting chip in a light emitting device according to the embodiment.
Figure 17:
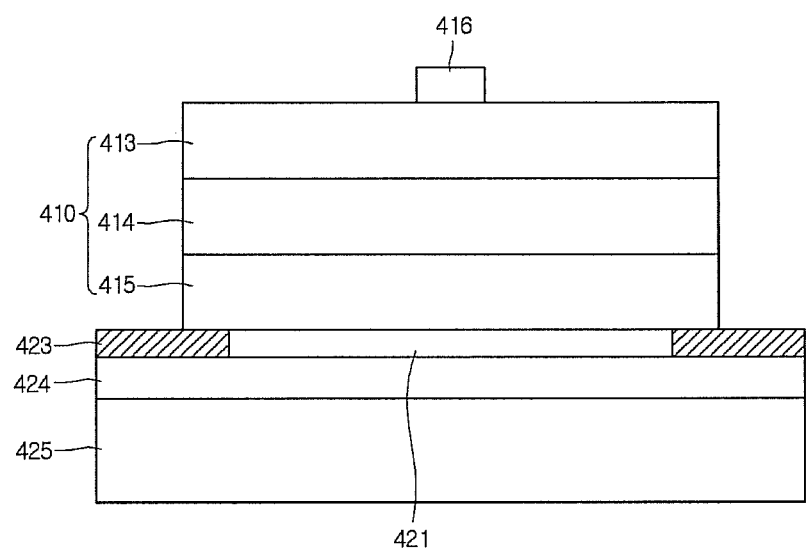
FIG. 17 is a sectional view showing another example of a light emitting chip in a light emitting device according to the embodiment.

The light emitting chip 161 may have a chip structure including horizontally arranged electrodes as shown in FIG. 16 or may have a chip structure including vertically arranged electrodes as shown in FIG. 17, but the embodiment is not limited thereto.

The light emitting chip 161 may include an LED chip including a semiconductor compound, for example, may include at least one of a UV (Ultraviolet) LED chip, a blue LED chip, a green LED chip, a white LED chip, and a red LED chip. The light emitting chip 161 may include at least one of group II-VI compound semiconductors and group III-V compound semiconductors. An active layer of the light emitting chip 161 may have at least one of a dual bonding structure, a single well structure, a multi-well structure, a single quantum well structure, a multi-quantum well structure, a quantum wire structure, and a quantum dot structure. The active layer may be formed by alternately arranging well/barrier layers. For example, the well/barrier layers may be formed at two to 30 cycles of the stack structure of InGaN/GaN, GaN/AlGaN, InGaN/AlGaN, InGaN/InGaN, or InAlGaN/InAlGaN. In addition, the active layer may include semiconductors such as ZnS, ZnSe, SiC, GaP, GaAlAs, MN, InN, and AlInGaP, but the embodiment is not limited thereto. The light emission wavelength of the active layer may be emitted as one selected from an ultraviolet band light to a visible band light, but the embodiment is not limited thereto.

Referring to FIGS. 1, 3, and 4, a second opening 150A is spaced apart from the first opening 150. The second opening 150A is a region to open the first and second bodies 141 and 151. The second open 150A is a region to expose the first and second lead frames 121 and 131, and may be defined as the second region. A protective device 163 may be disposed on at least one of the first and second lead frames 121 and 131 exposed to the second opening 150A. The protective device 163 may be bonded by using a conductive adhesive agent, but the embodiment is not limited thereto. The protective device 163 may be mounted on the first lead frame 121, and may be connected to the second lead frame 131 through a third wire 168.

The first and second bodies 141 and 151 serve as a partition between the first and second openings 150 and 150A. The thickness of the first body 141 disposed between the first and second openings 150 and 150A may be equal to, less than, or greater than the thickness of the protective device 163. When the thickness of the first body 141 may be thicker than the thickness of the protective device 163, light loss can be reduced. The circumference of the second opening 150A may be perpendicular or inclined with respect to the top surfaces of the first and second lead frames 121 and 131. Although the protective device 163 is disposed in the second opening 150A, the protective device 163 may be disposed in another region, or may be removed. In addition, the embodiment is not limited thereto.

The resin layer 171 is formed in the first opening 150 of the second body 151. The resin layer 171 may include a transmissive resin material such as silicon or epoxy. The resin layer 171 may include a material representing at least 70% of the transmittance, for example, at least 90% of the transmittance with respect to the wavelength emitted from the light emitting chip. The wavelength may be a blue peak wavelength, a UV wavelength, a red peak wavelength or a green peak wavelength.

The top surface of the resin layer 171 may be higher than a top surface of the light emitting chip 161. The top surface of the resin layer 171 may be higher than the high points of the wires 165 and 166. The circumference of the top surface of the resin layer 171 may be equal to or different from the top surface of the second body 151, but the embodiment is not limited thereto.

The top surface of the resin layer 171 may include at least one of a flat surface, a concave surface, a convex surface, and a rough surface, but the embodiment is not limited thereto.

The refractive index of the resin layer 171 is 1.6 or less, and the refractive index of the second body 151 may be equal to or lower than that of the resin layer 171. In addition, the difference in the refractive index between the second body 151 and the resin layer 171 may be ±0.2. For example, the refractive index of the second body 151 may be in the range of about 1.4 to 1.8, but the embodiment is not limited thereto.

The resin layer 171 may include at least one selected from the group of a filler, a dispersing agent, pigments, a phosphor, and a reflective material. The phosphor mixed in the resin layer 171 absorbs light emitted from the light emitting chip 161 and converts the wavelength of the light into light having a different wavelength. The phosphor may include at least one of a yellow phosphor, a green phosphor, a blue phosphor and a red phosphor. For instance, the phosphor may include at least one selected from the group consisting of a nitride based phosphor, an oxy-nitride based phosphor and a sialon based phosphor, which are mainly activated by lanthanoid based elements, such as Eu or Ce; an alkali earth halogen apatite phosphor, which is mainly activated by a lanthanoid based element, such as Eu, or a transient metallic element, such as Mn; an alkali earth metal boric acid halogen phosphor; an alkali earth metal aluminate phosphor; an alkali earth silicate; an alkali earth sulfide; an alkali earth thio-gallate; an alkali earth silicon nitride; a germinate; a rare-earth aluminate mainly activated by a lanthanoid based element, such as Ce; a rare-earth silicate; and an organic chelating agent mainly activated by a lanthanoid based element, such as Eu, but the embodiment is not limited thereto.

The resin layer 171 may be formed with a width to cover the surface of the light emitting chip 161 and may make contact with the top surface and the lateral side of the light emitting chip 161. Alternatively, a phosphor layer may be formed between the light emitting chip 161 and the resin layer 171, and may be formed only on the top surface of the light emitting chip 161.

As shown in FIG. 2, the optical lens 181 is disposed on the resin layer 171. The optical lens 181 may include a transmissive resin material such as silicon or epoxy, or a glass material. The refractive index of the optical lens 181 may be equal to or lower than that of the resin layer 171. The optical lens 181 may be disposed on the upper portion of the resin layer 171 and the second body 151. An adhesive layer may be formed on at least one of the top surface of the first body 141, the bottom surface of the second body 151, and the top surface of the second body 151 for the bonding purpose.

A portion of the light exit surface 182 of the optical lens 181 may be formed outward beyond the outer surface S5 of the second body 151, and make contact with the top surface of the first body 141. A portion of the light exit surface 182 of the optical lens 181 may cover the circumference of the second body 151 to densely make contact with the outer surface S5 of the second body 151, and may adjust the orientation angle of the second light L2 reflected by the first body 141 or the first light L1 passing through the second body 151 as shown in FIG. 2.

The circumference of the optical lens 181 may have a circular shape for the purpose of light distribution, and may have a circular shape or an oval shape when viewed from the top.

A concave part 185 may be formed at the central portion of the top surface of the optical lens 181. The concave part 185 is formed corresponding to the light emitting chip 161, and formed downward from the top surface of the optical lens 181 toward the light emitting chip 161. The concave part 185 of the optical lens 181 includes a total reflection surface in which the light reflected from the top surface of the first body 141 can be refracted toward another direction and the light exit surface 182 transmitting a portion of light. The total reflection surface is formed by the concave part 185, and the light exit surface 182 is disposed around the total reflection surface to refract the light reflected from the total reflection surface. The concave part 185 may have a circular shape when viewed from the top. The cross sectional surface of the concave part 185 may have a hemispherical shape or a conical shape. A reflective member may be filled in the concave part 185. The reflective member is formed at a preset depth in the concave part 185 to reflect the light passing through the surface of the concave part 185. The reflective member may include resin material having metallic oxide, and at least 3 wt % of the metallic oxide may be added in the resin material. The reflective member may include a material having a refractive index higher than that of the optical lens 181.

Referring to FIGS. 3 and 4, a portion 183 of the optical lens 181 is filled in the second opening 150A, or a portion of the resin layer may be formed in the second opening 150A, but the embodiment is not limited thereto.

The concave part 185 may not be formed in the central portion of the top surface of the optical lens 181. The optical lens 181 may have a hemispherical shape or may have a concave-convex pattern.

A plurality of support bosses may be formed at the circumference of the lower portion of the optical lens 181. The support bosses are coupled with the substrate or the cover to fix the optical lens 181. In addition, the optical lens 181 may be coupled with the upper portion of the second body 147 of the light emitting device after previously-injection molding, but the embodiment is not limited thereto.

Figure 15:
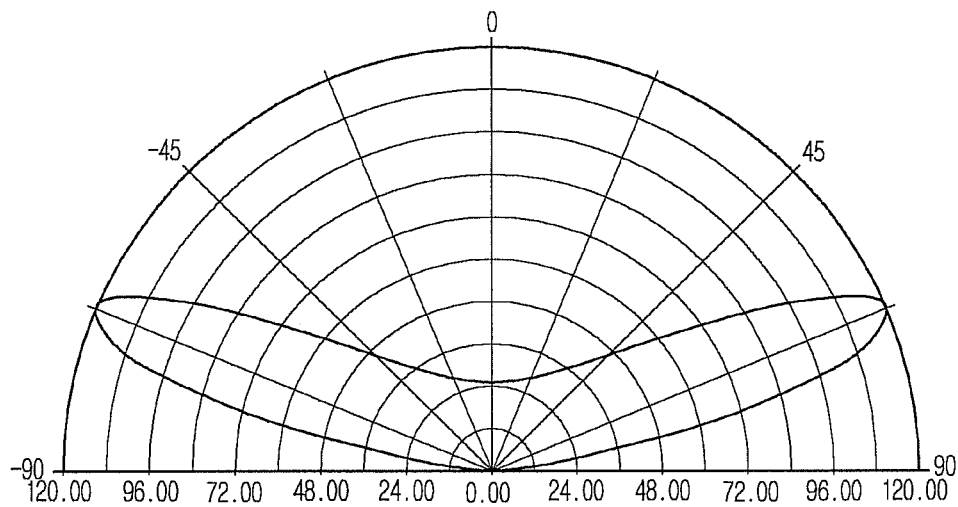
FIG. 15 is a view showing a light orientation angle of the light emitting device of FIG. 2.

Referring to FIGS. 1 and 2, the light emitted from the light emitting chip 161 of the light emitting device 100 is emitted in a lateral direction or in an upward direction. In this case, the portion of light passing through the resin layer 171 passes through the second body 151, and the remaining portions of the light are incident into the optical lens 181 through the top surface of the resin layer 171. In addition, a portion of the light incident into the optical lens 181 is reflected by the total reflection surface of the concave part 185, and the reflected light may be reflected by the top surface of the second body 151. In addition, a portion of the light passing through the second body 151 may be reflected by the top surface of the first body 141. Accordingly, the light emitting device 100 may emit light in a substantially horizontal direction by the first body 141 lower than the top surface of the light emitting chip 161, so that the main beam may be emitted at an orientation angle of at least 135° as shown in FIG. 15. In addition, as shown in FIG. 8, as an angle θ1 is increased, the light orientation angle is more increased. As the angle θ1 is reduced, the light orientation angle is more reduced. Accordingly, the light orientation angle θ1 can be adjusted according to the inclination surface or the thickness of the first body 141.

[Method of Manufacturing Light Emitting Device of First Embodiment]

As shown in FIGS. 5 and 6, the first body 141 having the open region 150-1 is injection-molded on the lead frames 121 and 131 through a molding scheme by using a resin material representing higher reflectance than transmittance. After the first body 141 has been formed as shown in FIG. 7, the transmissive second body 151 is injection-molded through a transfer scheme or an injection scheme by using the resin material representing higher transmittance than reflectance. The first and second openings 150 and 151 are formed in the second body 151. In addition, as shown in FIGS. 2 and 3, the light emitting chip 161 is mounted on the lead frames 121 and 131 exposed through the first opening 150 of the second body 151, and the protective device 163 is mounted on the lead frames 121 and 131 exposed through the second opening 150A. In addition, the light emitting chip 161 and the protective device 163 are electrically connected to the lead frames 121 and 131 through the wires 165, 166, and 168. In addition, the resin layer 171 is formed in the first opening 150 of the second body 151 through a dispensing scheme or a molding scheme, and a phosphor may be added in the resin layer 171. The optical lens 181 is coupled with the upper portion of the resin layer 171. The optical lens 181 may be injection-molded through a transfer molding scheme, or an optical lens 181, which has been previously prepared, may be bonded through the bonding scheme. Another resin layer may be further interposed between the resin layer 171 and the optical lens 181, but the embodiment is not limited thereto. An adhesive layer may be formed on the top surfaces of the first body 141 and the second body 151, but the embodiment is not limited thereto.

Second Embodiment

Figure 9:
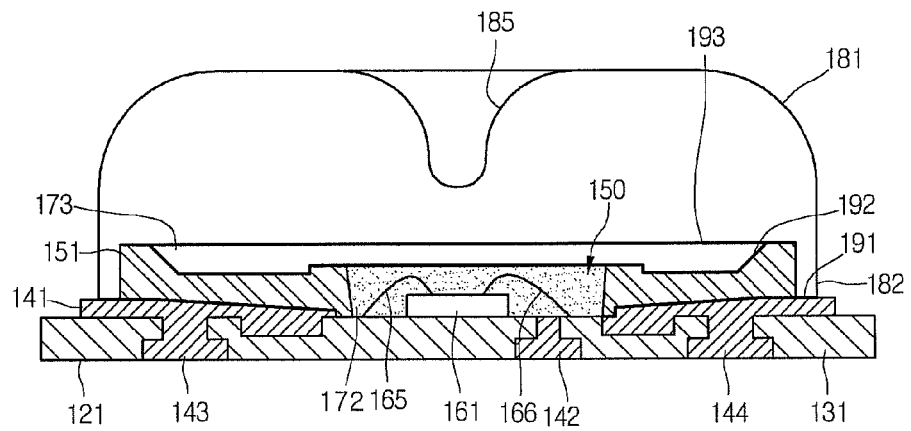
FIG. 9 is a side sectional view showing a light emitting device according to a second embodiment.

FIG. 9 is a view showing a light emitting device according to the second embodiment. In the following description of the second embodiment, the same parts as those of the first embodiment will make a reference to the first embodiment.

Referring to FIG. 9, the light emitting device includes the lead frames 121 and 131, the first body 141, the second body 151, a first resin layer 172, a second resin layer 173, and an optical lens 181.

The first resin layer 172 is formed in the first opening 150 corresponding to the resin layer of FIG. 2. The first resin layer 172 may include transmissive resin material, and may have a phosphor therein.

The second resin layer 173 is disposed between the first resin layer 172 and the optical lens 181. A portion of the second resin layer 173 may be disposed between the second body 151 and the optical lens 181. The second resin layer 173 may include a transmissive resin material such as silicon or epoxy. The second resin layer 173 may have impurities such as a phosphor therein or may not have impurities such as the phosphor therein.

The top surface of the second resin layer 173 may have a height equal to or higher than that of the top surface of the second body 151. The optical lens 181 may be disposed on the outer portions of the second resin layer 173 and the second body 151. A portion of the light exit surface 182 of the optical lens 181 may make contact with the outer portion of the second body 151 and may make contact with the top surface of the outer portion of the first body 141. Accordingly, the coupling strength of the optical lens 181 may be increased.

At least one of the first and second resin layers 172 and 173 may include at least one of a filler, a dispersing agent, figments, a phosphor, and a reflective material. A phosphor is contained in the first resin layer 172, and the second resin layer 173 may not contain an impurities such as the phosphor. In addition, the first and second resin layers 172 and 173 may include phosphors emitting the same wavelength or different wavelengths, but the embodiment is not limited thereto.

The first adhesive layer 191 is interposed between the first body 141 and the second body 151 and bonds the first body 141 and the second body 151 including different resin materials to each other. The second adhesive layer 192 may be interposed between the second body 151 and the second resin layer 173, and may be bonded between the second body 151 and the second resin layer 173. The second resin layer 173 is disposed on the top surface thereof with a third adhesive layer 193, and the third adhesive layer 193 may improve the adhesive strength with the optical lens 181.

The first to third adhesive layers 191, 192, and 193 may include resin material such as silicon or epoxy in order to improve the adhesive strength, and may have the thickness of 1 μm to 10 μm.

The first adhesive layer 191 may include reflective metal or a scattering agent in order to improve the reflectance, and the second and third adhesive layers 192 and 193 may include a dispersing agent or a phosphor, but the embodiment is not limited t hereto.

Third Embodiment

Figure 10:
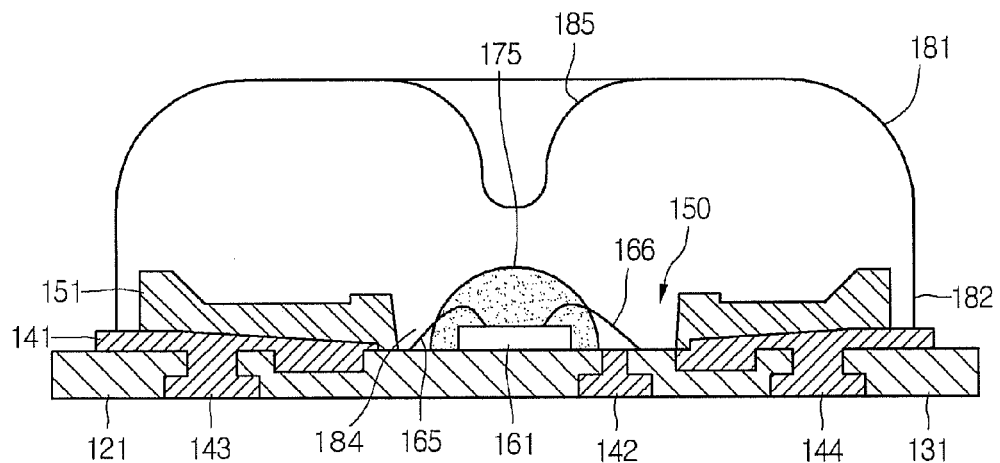
FIG. 10 is a side sectional view showing a light emitting device according to a third embodiment.

FIG. 10 is a view showing a light emitting device according to the third embodiment. Hereinafter, in the following description of the third embodiment, the same parts as those of the first embodiment will make a reference to the first embodiment.

Referring to FIG. 10, in the light emitting device, the first opening 150 is formed in the second body 151, and a resin layer such as a phosphor layer 175 is disposed in the first opening 150. The surface of the phosphor layer 175 may be formed on the circumference of the light emitting chip 161 within the uniform distance from the center of the light emitting chip 161. The phosphor layer 175 has a hemispherical shape so that the distribution of lights having the wavelength converted by the phosphor can be uniformly adjusted. The top surface of the phosphor layer 175 may more protrude from the top surface of the second body 151, and the bottom surface of the phosphor layer 175 may have a width wider than that of the light emitting chip 161. The width of the lower portion of the phosphor layer 175 may be narrower than the interval between the first wire 165 and the second wire 166, but the embodiment is not limited thereto.

The peripheral portion of the phosphor layer 175 in the first opening 150 of the second body 151 may be filled with a portion 184 of the optical lens 181, may include a resin material, or may be disposed in the form of a space. The material filled in the first opening 150 may make contact with the phosphor layer 175. When the second body 151 representing higher transmittance is disposed around the light emitting chip 161, so that the first light is emitted from the light emitting chip 161, and the second light having the wavelength converted by the phosphor layer 175 is emitted, the first and second lights may be emitted at a light orientation angle of at least 130°.

Fourth Embodiment

Figure 11:
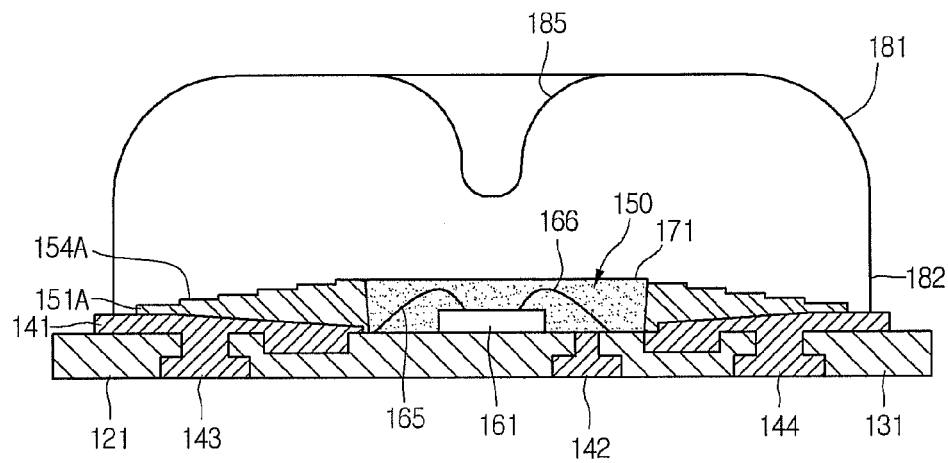
FIG. 11 is a side sectional view showing a light emitting device according to a fourth embodiment.

FIG. 11 is a view showing a light emitting device according to the fourth embodiment. Hereinafter, in the following description of the fourth embodiment, the same parts as those of the first embodiment will make a reference to the first embodiment.

Referring to FIG. 11, the light emitting device is an example formed by modifying an upper portion 154A of the second body 151 representing higher transmittance. The upper portion 154A of the second body 151 may have a step difference structure. The upper portion 154A of the second body 151 has a thickness gradually thinner from an inner part adjacent to the light emitting chip 161 to an outer portion thereof. The upper portion 154A of the second body 151 has the step difference structure, so that the contact area with the optical lens 181 is increased. Accordingly, the adhesive strength can be improved.

In addition, the second body 151 may have a thinner thickness at the inner part thereof and a thicker thickness at the outer part thereof so that the second body 151 supports the optical lens 181 and the first body 141, and the light emitted from the light emitting chip 161 is transmitted.

Fifth Embodiment

Figure 12:
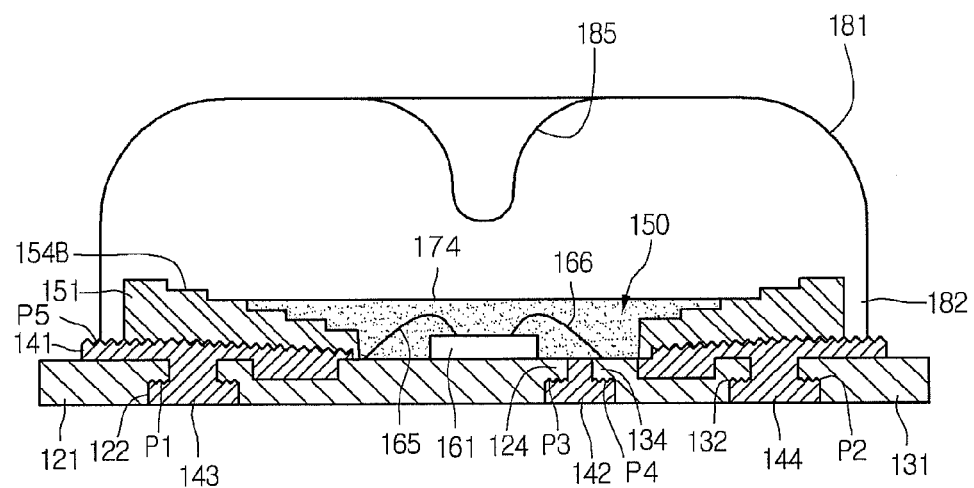
FIG. 12 is a side sectional view showing a light emitting device according to a fifth embodiment.

FIG. 12 is a view showing a light emitting device according to the fifth embodiment. Hereinafter, in the following description of the fifth embodiment, the same parts as those of the first embodiment will make a reference to the first embodiment.

Referring to FIG. 12, in the light emitting device, first to fourth concave-convex structures P1, P2, P3, and P4 may be formed in the first and second lead frames 121 and 131. The first and second concave-convex structures P1 and P2 have preset patterns, and may be formed at a step difference region of the first lead frame 121 exposed to the first hole 122 of the first lead frame 121 and at a step difference region of the second lead frame 131 exposed to the second hole 132 of the second lead frame 131. The first and second concave-convex structures P1 and P2 may increase the contact area with the first coupling part 143 of the first body 141 and the second coupling part 144 of the first body 141. Accordingly, moisture can be prevented from being infiltrated between the first body 141 and the holes 122 and 132 of the lead frames 121 and 131. The concave-convex structure P1 and P2 may include at least one of a lattice shape, a stripe shape, and a mesh shape.

In addition, the third and fourth concave-convex structures P3 and P4 are formed with preset patterns on the bottom surfaces of the first end portion 124 of the first lead frame 121 and the second end portion 134 of the second lead frame 131, so that the third and fourth concave-convex structures P3 and P4 may increase the adhesion area with the gap part 142 of the first body 141. The moisture can be prevented from being infiltrated through the gap part 142 between the first body 141 and the lead frames 121 and 131.

Alternatively, fine concave-convex structures are additionally formed on the top surface of the first and second lead frames 121 and 131, thereby enhancing the adhesion with the first body 141, so that moisture can be prevented from being infiltrated.

The fifth concave-convex structure P5 having a preset shape is formed on the top surface of the first body 141, and increases the adhesion area between the second body 151 and the light exit surface 182 of the optical lens 181, and moisture can be prevented from being infiltrated.

The upper portion 154B of the second body 151 may have a step difference structure gradually lowered from an outer portion thereof to an inner portion thereof. The resin layer 174 may be formed from the upper portion 154B of the second body 151 to the inner portion of the second body 151, but the embodiment is not limited thereto.

The resin layer 174 may include a transmissive resin material, and may have a phosphor therein. Alternatively, a phosphor layer may be bonded to a region between the resin layer 174 and the light emitting chip 161, that is, on the top surface of the light emitting chip 161.

Sixth Embodiment

Figure 13:
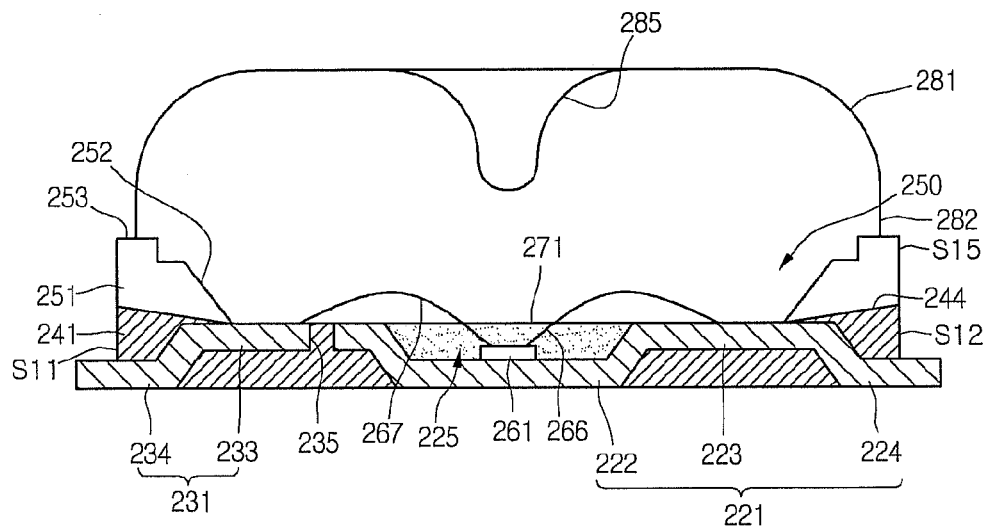
FIG. 13 is a side sectional view showing a light emitting device according to a sixth embodiment.

FIG. 13 is a view showing a light emitting device according to a sixth embodiment. Hereinafter, in the following description of the sixth embodiment, the same parts as those of the first embodiment will make a reference to the first embodiment.

Referring to FIG. 13, the light emitting device includes a first lead frame 221, a second lead frame 231, a first body 241, a second body 251, a resin layer 271, and an optical lens 281.

The first lead frame 221 includes a heat radiation part 222 having a cavity 225, a first connection part 223, and a first lead part 224. The cavity 225 has a concave inner part formed due to the bending of the heat radiation part 222. The first connection part 223 is bent from the heat radiation part 22, and exposed on the first opening 250 of the second body 251.

The first lead part 224 is bent from the first connection part 223 and extends to the bottom surface of the first body 241 through the first body 241. The first lead part 224 may protrude outward beyond the second lateral side S12 of the first body 241.

The first lead frame 221 may include at least one of grooves and holes for the coupling purpose with the first body 241, but the embodiment is not limited thereto. A light emitting chip 261 is disposed on the bottom surface of the cavity 225 of the heat radiation part 222. The lateral side of the cavity 225 is perpendicular to the bottom surface of the first body 241 or is inclined at an angle of at least 90° with respect to the bottom surface of the first body 241, thereby reflecting light of the light emitting chip 261. The heat radiation part 222 may radiate heat emitted from the light emitting chip 261 through a substrate or a heat radiation plate.

The second lead frame 2431 includes a second connection part 233 and a second lead part 234. The second connection part 233 is exposed to the first opening 250 of the second body 251, and the second lead part 234 extends from the second connection part 233 to the bottom surface of the first body 241 through the first body 241. The second lead part 234 may protrude outward beyond the first lateral side S11 of the first body 241.

The first connection part 223 of the first lead frame 221 and the second connection part 233 of the second lead frame 231 are exposed in the first opening 250 of the second body 251, and the second body 251 is disposed at the central portion thereof with the cavity 225.

The first connection part 223 of the first lead frame 221 and the second connection part 233 of the second lead frame 231 are exposed to the upper portion of the first body 241. The light emitting chip 261 may be connected to the first connection part 223 through the first wire 266, and may be connected to the second connection part 233 through the second wire 267.

The first body 241 may include a material representing reflectance higher than transmittance. The first body 241 is disposed under the first lead frame 221 and the second lead frame 231, and a portion of the first body 241 may be formed at the gap 235 between the first and second lead frames 221 and 231. In addition, an outer portion of the first body 241 may be formed on the top surfaces of the first and second lead frames 221 and 231.

The outer portion of the top surface 244 of the first body 241 is inclined, and an angle between an outer portion of the top surface 244 adjacent to the first lateral side S11 and an outer portion of the top surface 244 adjacent to the second lateral side S12 may be in the range of 140° to 170°.

The second body 251 representing high transmittance is disposed around the top surface of the first body 241. The second body 251 transmits the incident light to widen the light orientation angle. The inner lateral side 252 of the second body 251 may be inclined, but the embodiment is not limited thereto.

The resin layer 271 is formed in the cavity 225. The resin layer 271 may include a resin material such as silicon or epoxy. The resin layer 271 may include at least one of a filler, a dispersing agent, figments, a phosphor, and a reflective material.

The upper portion 253 of the second body 251 has a step difference structure, and the lower portion of the light exit surface 282 of the optical lens 281 may be coupled to the step difference structure. The optical lens 281 is disposed at the central portion thereof with a concave part 285. The bottom surface of the optical lens 281 may make contact with the top surface of the resin layer 271, or may be spaced apart from the resin layer 271. Another resin layer may be further disposed between the optical lens 281 and the resin layer 271, but the embodiment is not limited thereto.

The second body 251 is disposed in the first opening 250 thereof with wires 266 and 267 or a different resin layer. The outer surface S15 of the second body 251 may be vertically aligned in line with the first and second lateral sides S11 and S12 of the first body 241, but the embodiment is not limited thereto.

Seventh Embodiment

Figure 14:
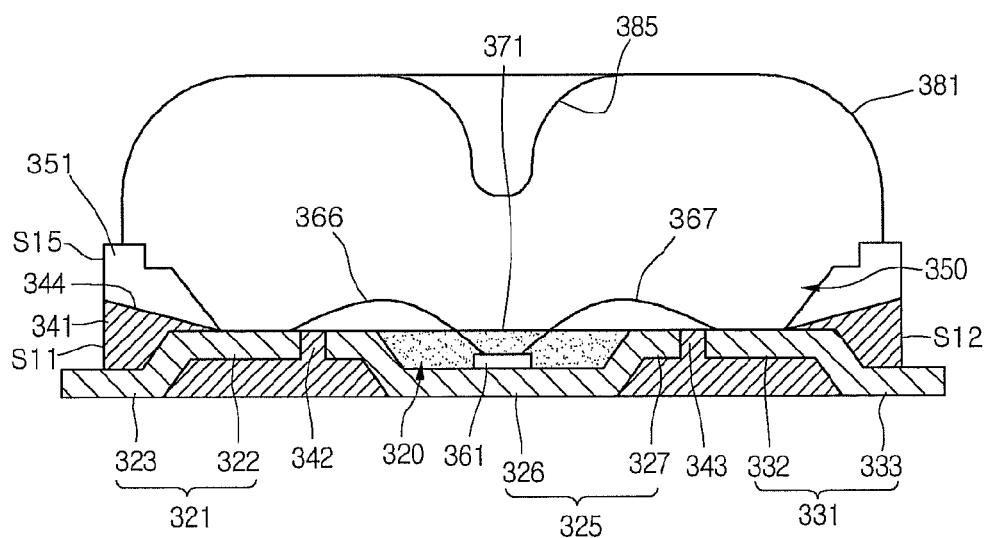
FIG. 14 is a side sectional view showing a light emitting device according to a seventh embodiment.

FIG. 14 is a view showing a light emitting device according to a seventh embodiment. Hereinafter, in the following description of the seventh embodiment, the same parts as those of the first embodiment will make a reference to the first embodiment.

Referring to FIG. 14, the light emitting device includes a first lead frame 321, a second lead frame 331, a third lead frame 325 between the first and second lead frames 321 and 331, a resin layer 371 on the third lead frame 325, a first body 341 representing reflectance and supporting the first to third lead frames 321, 331, and 325, a second body 351 representing transmittance on the first body 341, and an optical lens 381 on the resin layer 371.

The first lead frame 321 is interposed between a first lateral side S11 of the first body 341 and the third lead frame 325, and includes a first connection part 322 and a first lead part 323. The first connection part 322 is exposed to the top surface of the first body 341, and connected with the light emitting chip 361 through a first wire 366. The first lead part 323 is bent or extends from the first connection part 322 in the first body 341 so that the first lead part 323 is disposed on the bottom surface of the first body 341. The first lead part 323 may protrude toward the first lateral side S11 of the first body 341.

The second lead frame 331 is interposed between the second lateral side S12 of the first body 341 and the third lead frame 325, and includes a second connection part 332 and a second lead part 333. The second connection part 332 is exposed to the top surface of the first body 341, and connected to the light emitting chip 361 through the second wire 367. The second lead part 333 is bent in the first body 341, and extends to the bottom surface of the first body 341 while protruding the second lateral side S12 of the first body 341.

The third lead frame 325 includes a heat radiation part 326 having a cavity 320 and a support part 327 bent from the heat radiation part 326. The light emitting chip 361 is disposed on the bottom surface of the cavity 329, and the bottom surface of the heat radiation part 326 may be exposed to the bottom surface of the first body 341. The support part 327 may be exposed to the top surface of the first body 341, but the embodiment is not limited thereto. The heat radiation part 326 may radiate heat generated from the light emitting chip 361 through the substrate disposed at the lower portion or a heat radiation plate.

The first body 341 includes a first gap part 342 interposed between the first and third lead frames 321 and 325 and a second gap part 343 interposed between the third and second lead frames 325 and 331.

The first connection part 322 of the first lead frame 321 and the second connection part 332 of the second lead frame 331 are exposed in the first opening 350 of the second body 351, and the cavity 320 is disposed at the central portion of the second body 351.

The light emitting chip 361 is disposed on the bottom surface of the cavity 320. The light emitting chip 361 is connected to the first connection part 322 of the first lead frame 321 through the first wire 366, and connected to the second connection part 332 of the second lead frame 331 through the second wire 367.

A transmissive support layer 371 is formed in the cavity 320. The transmissive support layer 371 may be aligned in line with the top surface of the first body 341, but the embodiment is not limited thereto. The resin layer 371 may include a resin material such as silicon or epoxy. The resin layer 371 may include at least one of a filler, a dispersing agent, pigments, phosphors, and a reflective material The first body 341 corresponds to the first body of the first embodiment. The top surface 344 of the outer portion of the first body 341 may be inclined, and an interior angle about the inclined surface of the first body 341 may be in the range of at least 135° to less than 180°.

The second body 351 may correspond to the second body of the first embodiment, and the first opening 350 formed inside the second body 351 may have a width wider than the width of the top surface of the cavity 320, but the embodiment is not limited thereto.

The top surface of the light emitting chip 361 may be lower than the top surface of the first body 341, but the embodiment is not limited thereto. The light emitted from the light emitting chip 361 may be reflected by a concave part 385 of the optical lens 381, and the reflected light may be reflected by the top surface and the inclined surface of the first body 341. The light incident into the second body 351 is transmitted to wide the light orientation angle.

The light exit surface of the optical lens 381 may be disposed inward beyond a lateral side S15 of the second body 351, but the embodiment is not limited thereto.

Alternatively, the top surface of the light emitting chip 361 may be exposed to the top surface of the first body 341. In this case, the light emitted from the light emitting chip 361 is reflected by the top surface and the inclined surface of the first body 341, or passes through the second body 351. Accordingly, the light orientation angle can be widened. In this case, the depth of the cavity 320 may be varied according to the bending of the heat radiation part 326 of the third lead frame 325, and the depth of the cavity 329 may be adjusted.

The light emitting device chip according to the embodiment will be described referring to example of FIGS. 16 and 17.

FIG. 16 is a side sectional view showing one example of the light emitting chip according to the embodiment.

Referring to FIG. 16, the light emitting chip includes a substrate 411, a buffer layer 412, a light emitting structure 410, a first electrode 416, and a second electrode 417. The substrate 411 may include a substrate including a transmissive material or a non-transmissive material, and may include a conductive substrate or an insulating substrate.

The buffer layer 412 reduces the lattice constant difference between the materials constituting the substrate 411 and the light emitting structure 410, and may include a nitride semiconductor. A nitride semiconductor layer, which is not doped with dopants, is further disposed between the buffer layer 412 and the light emitting structure 410, so that the crystal quality can be improved.

The light emitting structure 410 includes a first conductive semiconductor layer 413, an active layer 414, and a second conductive semiconductor layer 415.

The first conductive semiconductor layer 413 may include the group III-V compound semiconductor doped with the first conductive dopant. For example, the first conductive semiconductor layer 413 may include the semiconductor material having the compositional formula of $In_xAl_yGa_{1-x-y}N$ ($0 \le x \le 1$, $0 \le y \le 1$, $0 \le x+y \le 1$). In detail, the first conductive semiconductor layer 413 may include the stack structure of layers including one selected from the group consisting of GaN, InN, AlN, InGaN, AlGaN, InAlGaN, AlInN, AlGaAs, GaP, GaAs, GaAsP, and AlGaInP. If the first conductive semiconductor layer 413 is an n type semiconductor layer, the first conductive dopant includes the n type dopant such as Si, Ge, Sn, Se, or Te.

A first clad layer may be formed between the first conductive semiconductor layer 413 and the active layer 414. The first clad layer may include a GaN-based semiconductor, and the bandgap of the first clad layer may be equal to or greater than the bandgap of the active layer 414. The first clad layer has the first conductive type, and confines carriers.

The active layer 414 is disposed on the first conductive semiconductor layer 413, and includes a single quantum well structure, a multiple quantum well (MQW) structure, a quantum wire structure or a quantum dot structure. The active layer 414 has the cycle of the well and barrier layers. The well layer may have the composition formula of $In_xAl_yGa_{1-x-y}N$ ($0 \le x \le 1$, $0 \le y \le 1$, $0 \le x+y \le 1$), and the barrier layer may have the composition formula of $In_xAl_yGa_{1-x-y}N$ ($0 \le x \le 1$, $0 \le y \le 1$, $0 \le x+y \le 1$). At least one cycle of the well/barrier layers may be used through the stack structure of InGaN/GaN, GaN/AlGaN, InGaN/AlGaN, InGaN/InGaN, and InAlGaN/InAlGaN. The barrier layer may include a semiconductor material having the bandgap higher than the bandgap of the well layer.

The second semiconductor conductive layer 415 is formed on the active layer 414. The second semiconductor conductive layer 415 includes a semiconductor doped with second conductive dopants, for example, includes a semiconductor having the composition formula of $In_xAl_yGa_{1-x-y}N$ ($0 \le x \le 1$, $0 \le y \le 1$, $0 \le x+y \le 1$). In detail, the second conductive semiconductor layer 415 may include one selected from compound semiconductors such as GaN, InN, MN, InGaN, AlGaN, InAlGaN, AlInN, AlGaAs, GaP, GaAs, GaAsP, and AlGaInP. If the second conductive semiconductor layer 415 is a p type semiconductor layer, the semiconductor conductive dopant includes the p type dopant such as Mg, Zn, Ca, Sr, or Ba.

The second conductive semiconductor layer 415 may include a superlattice structure, and the superlattice structure may include an InGaN/GaN superlattice structure or am AlGaN/GaN superlattice structure. The superlattice structure of the second conductive semiconductor layer 415 abnormally spreads the current, thereby protecting the active layer 414.

In addition, the light emitting structure 410 may have an opposite conductive type. For example, the first conductive semiconductor layer 413 may include a p type semiconductor layer, and the second conductive semiconductor layer 415 may include an n type semiconductor layer. The second conductive semiconductor layer 415 may be disposed thereon with a first conductive semiconductor layer having the polarity opposite to the second conductive type polarity.

The light emitting structure 410 may be realized by using one of an n-p junction structure, a p-n junction structure, an n-p-n junction structure, and a p-n-p junction structure. The "p" represents a p type semiconductor, the "n" represents an n type semiconductor layer, and the "-" represents that the p type semiconductor is directly or indirectly connected to the n type semiconductor. Hereinafter, a case that the uppermost layer of the light emitting structure 410 is the second conductive semiconductor layer 415 will be described for the convenience of explanation.

The first electrode 416 is disposed on the first conductive semiconductor layer 413, and the second electrode 417 having a current spreading layer is disposed on the second conductive semiconductor layer 415. The first and second electrodes 416 and 417 are connected to each other through a wire, or through another connection scheme.

FIG. 17 is a graph showing another example of the light emitting chip according to the embodiment. Hereinafter, in the following description of the embodiment, the details of the same parts as that of FIG. 16 will be omitted except for brief description.

Referring to FIG. 17, in a light emitting chip according to the embodiment, a contact layer 421 is formed under a light emitting structure 410, a reflective layer 424 is formed under the contact layer 421, a support member 425 is formed under the reflective layer 424, and a protective layer 423 may be formed around the reflective layer 424 and the light emitting structure 410.

One or a plurality of first electrodes 416 may be formed on the light emitting structure 410, and the first electrode 416 includes a pad bonded to a wire.

The light emitting chip may be formed by removing a growth substrate after forming a contact layer 421, a protective layer 423, a reflective layer 424, and a support member 423 under the second conductive semiconductor layer 415.

The contact layer 421 may make ohmic-contact with a lower layer of the light emitting structure 410, for example, the second conductive semiconductor layer 415, and may include a metallic oxide, a metallic nitride, an insulating material, or a conductive material. For example, the contact layer 421 may include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), Ag, Ni, Al, Rh, Pd, Ir, Ru, Mg, Zn, Pt, Au, Hf, and the selective combination thereof. The contact layer 421 may be formed in a multi-layer structure by using a metallic material and a transparent material such as IZO, IZTO, IAZO, IGZO, IGTO, AZO, or ATO. For example, the contact layer 421 may have the stack structure of IZO/Ni, AZO/Ag, IZO/Ag/Ni, or AZO/Ag/Ni. A layer to block current may be further formed in the contact layer 421 corresponding to the electrode 416.

The protective layer 423 may include a metallic oxide or an insulating material. For example, the protective layer 423 may selectively include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, or $TiO_2$. The protective layer 423 may be formed through a sputtering scheme or a deposition scheme. The metal constituting the reflective layer 424 may prevent the layers of the light emitting structure 410 from being shorted.

The reflective layer 424 may include metal such as Ag, Ni, Al, Rh, Pd, Ir, Ru, Mg, Zn, Pt, Au, Hf, or the selective combination thereof. The reflective layer 424 may have a width greater than the width of the light emitting structure 410, thereby improving the light reflection efficiency. A metallic layer for bonding and a metallic layer for thermal diffusion may be further disposed between the reflective layer 424 and the support member 425, but the embodiment is not limited thereto.

The support member 425 serves as a base substrate, and may include metal such as Cu, Au, Ni, Mo, or Cu—W, and a carrier wafer, such as Si, Ge, GaAs, ZnO, and SiC. An adhesive layer may be further formed between the support member 425 and the reflective layer 424, and bonds the two layers to each other. The disclosed light emitting chip is four the illustrative purpose, and the embodiment is not limited thereto. The light emitting chip may be selective applied to the light emitting device according to the embodiment, but the embodiment is not limited thereto.

<Lighting System>

The light emitting device according to the embodiment is applicable to a lighting system. The lighting system includes a structure in which a plurality of light emitting devices are arrayed. The lighting system includes a display apparatus shown in FIGS. 18 and 19, a lighting apparatus shown in FIGS. 20 and 21, a lighting lamp, a signal lamp, a headlamp for a vehicle, and an electronic display.

Figure 18:
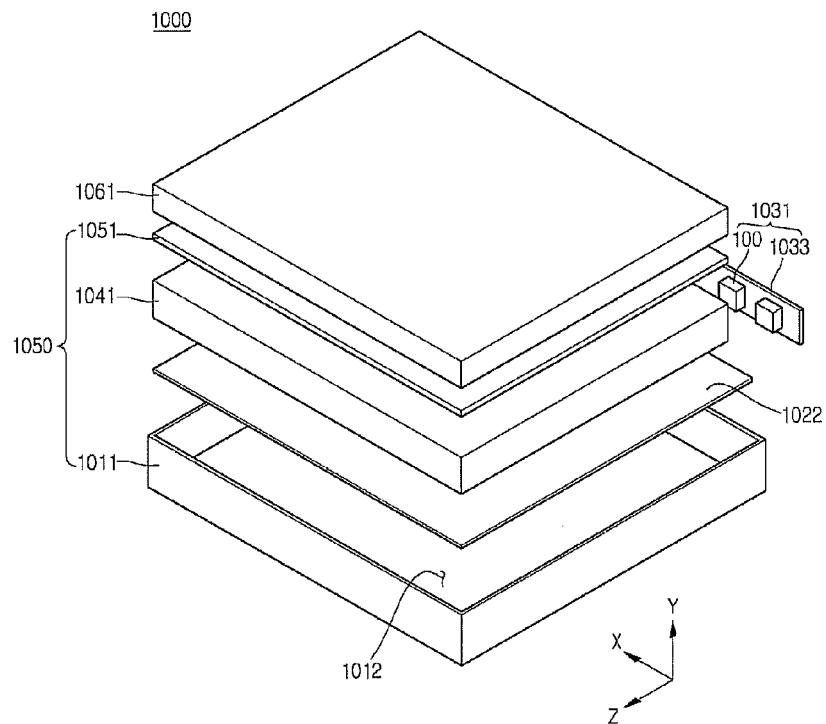
FIG. 18 is a perspective view showing a display apparatus having the light emitting device according to the embodiment.

FIG. 18 is an exploded perspective view showing a display apparatus having the light emitting device according to the embodiment.

Referring to FIG. 18, a display apparatus 1000 according to the embodiment includes a light guide plate 1041, a light emitting module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041, the optical sheet 1051, and the light unit 1050 may be defined as a light unit 1050.

The light guide plate 1041 diffuses the light supplied from the light emitting module 1031 to provide surface light. The light guide plate 1041 may include a transparent material. For example, the light guide plate 1041 may include one of acryl-based resin, such as PMMA (poly methyl methacrylate, PET (polyethylene terephthalate), PC (polycarbonate), COC (cyclic olefin copolymer) and PEN (polyethylene naphtha late) resin.

The light emitting module 1031 is disposed on at least one side of the light guide plate 1041 to supply the light to at least one side of the light guide plate 1041. The light emitting module 1031 serves as the light source of the display device.

At least one light emitting module 1031 is disposed to directly or indirectly supply the light from one side of the light guide plate 1041. The light emitting module 1031 may include a board 1033 and the light emitting device according to the embodiments or the light emitting device 100. The light emitting device or the light emitting device 100 are arranged on the board 1033 while being spaced apart from each other at the predetermined interval.

The board 1033 may include a printed circuit board (PCB) including a circuit pattern (not shown). In addition, the board 1033 may also include a metal core PCB (MCPCB) or a flexible PCB (FPCB) as well as a typical PCB, but the embodiment is not limited thereto. If the light emitting device 100 is installed on the side of the bottom cover 1011 or on a heat dissipation plate, the board 1033 may be omitted. The heat dissipation plate partially makes contact with the top surface of the bottom cover 1011.

In addition, the light emitting device 100 are arranged such that light exit surfaces to discharge light of the light emitting device 100 are spaced apart from the light guide plate 1041 by a predetermined distance on the board 1033, but the embodiment is not limited thereto. The light emitting device 100 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light emitting module 1031 as optical members, but the embodiment is not limited thereto.

Figure 19:
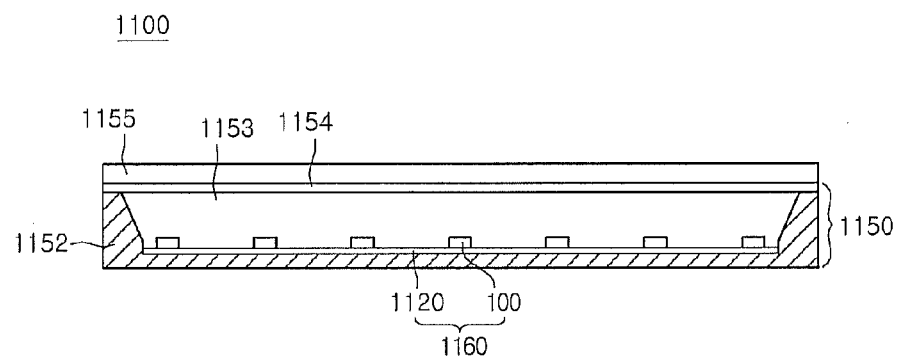
FIG. 19 is a sectional view showing a display apparatus according to the embodiment.

FIG. 19 is a sectional view showing a display apparatus according to the embodiment.

Referring to FIG. 19, the display device 1100 includes a bottom cover 1152, a board 1120 on which the light emitting device 100 are arrayed, an optical member 1154, and a display panel 1155.

The board 1120 and the light emitting device 100 may constitute the light emitting module 1160. In addition, the bottom cover 1152, at least one light emitting module 1160, and the optical member 1154 may constitute the light unit. The bottom cover 1151 can be disposed with a receiving section 1153, but the embodiment is not limited thereto. The light emitting module 1160 includes a board 1120, and a plurality of light emitting devices arranged on the board 1120 or a light emitting device 100.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light emitting module 1160 in order to convert the light emitted from the light emitting module 1160 into the surface light.

Figure 20:
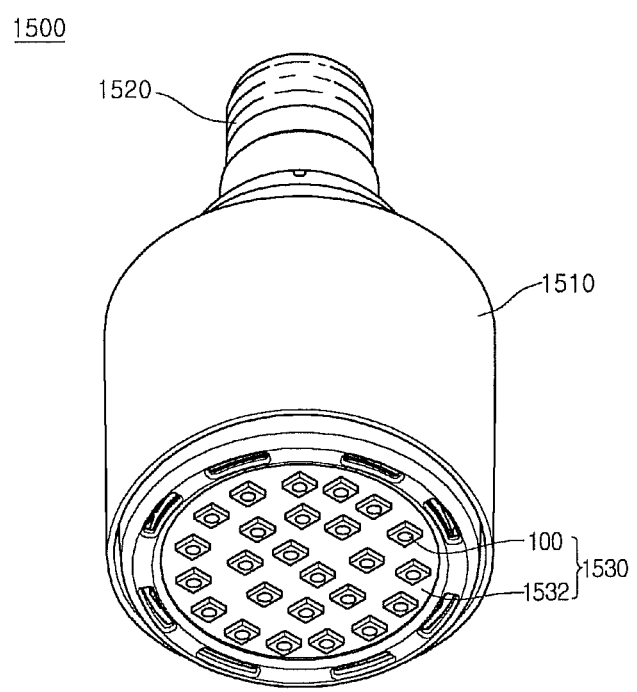
FIG. 20 is a perspective view of a lighting unit with the light emitting device.

FIG. 20 is a perspective view of a lighting unit according to an embodiment.

Referring to FIG. 20, the lighting unit 1500 may include a case 1510, a light emitting module 1530 including in the case 1510, and a connection terminal 1520 including in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device 100 according to the embodiments mounted on the board 1532. The light emitting device 100 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device 100 may be mounted on the board 1532. Each of the light emitting devices 100 may include at least one light emitting diode (LED) chip. The LED chip may include a color LED emitting red, green, blue or white light, and a UV LED emitting ultraviolet (UV).

The light emitting module 1530 may have a combination of various light emitting devices so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

Figure 21:
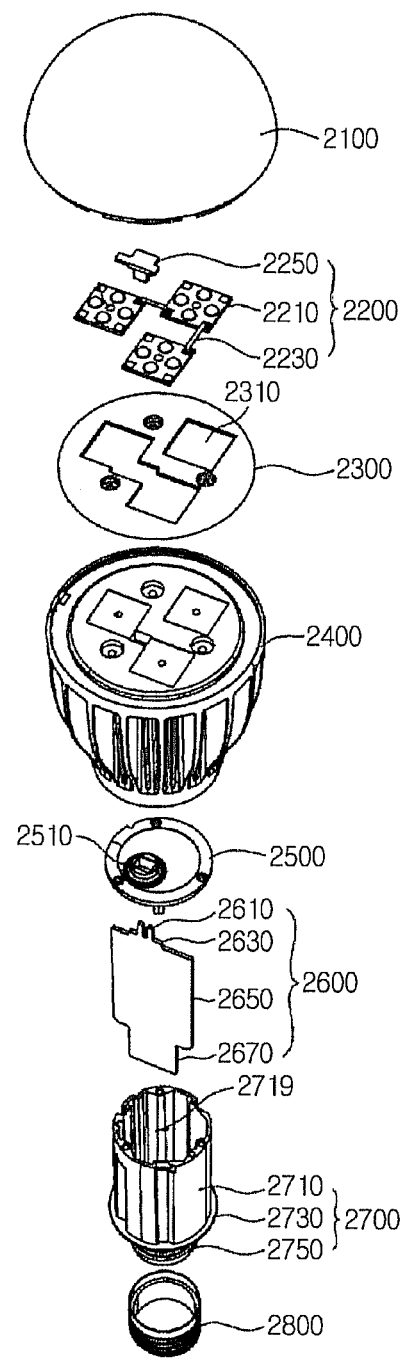
FIG. 21 is an exploded perspective view showing another example of a lighting unit having the light emitting device according to the embodiment.

FIG. 21 is an exploded perspective view showing another example of a lighting unit having the light emitting device according to the embodiment.

Referring to FIG. 21, the lighting device according to the embodiment may include a cover 2100, a light emitting module 2200, a heat radiation member 2400, a power supply part 2600, an inner case 2700, and a socket 2800. In addition, the light emitting device according to the embodiment may further include at least one of a member 2300 and a holder 2500. The light emitting module 2200 may include the light emitting device or the light emitting device package according to the embodiment.

For example, the cover 2100 has the shape of a bulb, or a hemispherical shape. The cover 2100 may have a hollow structure, and a portion of the cover 2100 may be open. The cover 2100 may be optically connected to the light emitting module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light emitting module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light emitting module 2200 may be recognized at the outside. In addition, the cover 2100 may be opaque. The cover 2100 may be formed through a blow molding scheme.

The light emitting module 2200 may be disposed at one surface of the heat radiation member 2400. Accordingly, the heat emitted from the light emitting module 2200 is conducted to the heat radiation member 2400. The light emitting module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light emitting module 2200, toward the cover 2100. Accordingly, the light efficiency of the lighting apparatus according to the embodiment can be improved.

The member 2300 may include an insulating material. The connection plate 2230 of the light emitting module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light emitting module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light emitting module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 250. For example, the parts include a DC converter, a driving chip to drive the light emitting module 220, and an ESD (electrostatic discharge) protective device to protect the light emitting module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

As described above, according to the embodiment, the light orientation angle of the light emitting device can be widened. According to the embodiment, the strength of the bodies can be enhanced by stacking a plurality of bodies. According to the embodiment, the number of the light emitting devices arranged in each light emitting module can be reduced. The embodiment can improve the reliability of the light emitting device and a lighting unit having the same.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
a plurality of lead frames;
a first body having a reflective material, disposed on top surfaces of the lead frames and having an open region at a predetermined region of the top surfaces of the plurality of lead frames;
a second body having a transmissive material, having a first opening corresponding to the open region of the first body, and disposed on a top surface of the first body;
a light emitting chip on at least one of the plurality of lead frames exposed in the first opening of the second body; and
a first resin layer disposed in the first opening of the second body to cover the light emitting chip,
wherein the light emitting chip is electrically connected to the plurality of lead frames,
wherein the first body and the second body are formed of a resin material,
wherein a top surface of an outer region of the first body has a height lower than a height of a top surface of the light emitting chip, and
wherein a first lead frame of the plurality of lead frames is disposed under the light emitting chip, includes a first groove recessed at a peripheral portion of the light emitting chip and a plurality of holes disposed around the first groove, and wherein the first body is disposed in the first groove and the plurality of holes.

2. The light emitting device of claim 1, wherein the top surface of the first body makes contact with a bottom surface of the second body.

3. The light emitting device of claim 2, wherein the first body includes an inner region adjacent to the light emitting chip and the outer region which is thicker than the inner region and extends from the inner region.

4. The light emitting device of claim 3, wherein a top surface of the inner region of the first body is inclined at an angle of 65° to 89° about a perpendicular line to the light emitting chip.

5. The light emitting device of claim 1, wherein the plurality of lead frames include a second lead frame spaced apart from a first lead frame and electrically connected to the light emitting chip, wherein the second lead frame includes a second groove, which is disposed adjacent to the first opening and has a shape of a line having a width longer than a width of the first opening, and a plurality of second holes disposed outside the second groove, the first body is disposed in the second groove and the plurality of second holes, and the plurality of second holes have a lower portion having a width wider than a width of an upper portion thereof.

6. The light emitting device of claim 1, wherein the first body includes a gap part disposed between the plurality of lead frames, and the gap part has a wider lower portion and a narrower upper portion.

7. The light emitting device of claim 1, wherein the first and second bodies include materials different from each other.

8. The light emitting device of claim 7, wherein the first body includes a white resin material, and the second body includes a transmissive silicon material or a transmissive epoxy resin material.

9. The light emitting device of claim 8, wherein the first body includes a material having at least 70% of reflectance with respect to a wavelength emitted from the light emitting chip, and the second body includes a material having at least 70% of transmittance with respect to a wavelength emitted from the light emitting chip.

10. The light emitting device of claim 1, wherein the second body includes an inner side portion being closer to the light emitting chip than an inner region of the first body and making contact with the lead frames exposed to the open region of the first body.

11. The light emitting device of claim 1, further comprising a phosphor disposed in the first resin layer and disposed on the top surface of the light emitting chip.

12. The light emitting device of claim 11, further comprising an optical lens disposed on the first resin layer and the second body, and a plurality of protrusions protruding from an upper portion of the second body and coupled with the optical lens.

13. The light emitting device of claim 12, further comprising a second resin layer between the first resin layer and the optical lens.

14. The light emitting device of claim 12, wherein the optical lens includes a concave part having an upper center concave toward the light emitting chip.

15. The light emitting chip of claim 1, wherein the first and second bodies include a second opening spaced apart from the first opening, a bottom surface of the second opening exposes the plurality of lead frames, and a protective device is disposed on at least one of the plurality of lead frames exposed through the second opening.

16. The light emitting device of claim 1, further comprising a transmissive adhesive layer between the first and second bodies.

17. A light emitting device comprising:
a first lead frame having a cavity;
a second lead frame spaced apart from the first lead frame;
a first body having a reflective material, disposed on the first and second lead frames, and exposing a predetermined region of top surfaces of the first and second lead frames;
a second body having a transmissive material, having a first opening corresponding to a central region of the first body, and disposed on a top surface of the first body;
a light emitting chip disposed in a cavity of the first lead frame and electrically connected to the first and second lead frames; and
a first resin layer in the cavity,
wherein the first body and the second body are formed of a resin material,
wherein the first body and the second body are not overlapped with the light emitting chip in a vertical direction, and
wherein a top surface of an outer region of the first body has a height lower than a height of a top surface of the light emitting chip, and
wherein a first lead frame of the plurality of lead frames is disposed under the light emitting chip, includes a first groove recessed at a peripheral portion of the light emitting chip and a plurality of holes disposed around the first groove, and wherein the first body is disposed in the first groove and the plurality of holes.

18. The light emitting device of claim 17, wherein the first lead frame includes a first connection part exposed to the central region of the first body and a first lead part extending from the first connection part to a bottom surface of the first body, and the second lead frame includes a second connection part exposed to the central region of the first body and a second lead part extending from the second connection part to the bottom surface of the first body.

19. The light emitting device of claim 17, wherein the top surface of the first body physically contacts a bottom surface of the second body.

20. The light emitting device of claim 2, wherein the first body includes an inner region adjacent to the light emitting chip and the outer region which is thicker than the inner region, and
wherein a top surface of the inner region of the first body is inclined at an angle of 65° to 89° about a perpendicular line to the light emitting chip.

* * * * *